United States Patent
Choi et al.

(10) Patent No.: US 10,283,204 B2
(45) Date of Patent: May 7, 2019

(54) METHODS OF OPERATING NONVOLATILE MEMORY DEVICES INCLUDING ERASING A SUB-BLOCK

(71) Applicant: Samsung Electronics Co., Ltd., Suwon-si (KR)

(72) Inventors: Chang-Min Choi, Seoul (KR); Dong-Chan Kim, Seoul (KR); Ae-Jeong Lee, Cheongju-si (KR); Moo-Rym Choi, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/607,551

(22) Filed: May 29, 2017

(65) Prior Publication Data
US 2018/0144802 A1   May 24, 2018

(30) Foreign Application Priority Data
Nov. 22, 2016   (KR) .................. 10-2016-0155680

(51) Int. Cl.
| G06F 12/02 | (2006.01) |
| G11C 11/56 | (2006.01) |
| G11C 16/04 | (2006.01) |
| G11C 16/22 | (2006.01) |
| G11C 16/34 | (2006.01) |

(52) U.S. Cl.
CPC ........ *G11C 16/225* (2013.01); *G06F 12/0246* (2013.01); *G11C 11/5635* (2013.01); *G11C 16/0483* (2013.01); *G11C 16/34* (2013.01)

(58) Field of Classification Search
None
See application file for complete search history.

(56) References Cited

U.S. PATENT DOCUMENTS

| 8,837,228 B2 | 9/2014 | Nam et al. |
| 8,885,420 B2 | 11/2014 | Oowada et al. |
| 8,964,481 B2 | 2/2015 | Oh et al. |
| 9,025,389 B2 | 5/2015 | Kim |
| 9,053,794 B2 | 6/2015 | Kwak |

(Continued)

FOREIGN PATENT DOCUMENTS

| JP | 2011-048871 A | 3/2011 |
| JP | 2013-200913 A | 10/2013 |

*Primary Examiner* — J. H. Hur
(74) *Attorney, Agent, or Firm* — Muir Patent Law, PLLC

(57) ABSTRACT

In a method of operating a nonvolatile memory device, a first sub-block to be erased is selected in a first memory block including the first sub-block and a second sub-block adjacent to the first sub-block, in response to a erase command and an address. The first sub-block includes memory cells connected to a plurality of word-lines including at least one boundary word-line adjacent to the second sub-block and internal word-lines other than the at least one boundary word-line. An erase voltage is applied to a substrate in which the first memory block is formed. Based on a voltage level of the erase voltage applied to the substrate, applying, a first erase bias condition to the at least one boundary word-line and a second erase bias condition different from the first erase bias condition to the internal word-lines during an erase operation being performed on the first sub-block.

18 Claims, 19 Drawing Sheets

(56) References Cited

U.S. PATENT DOCUMENTS

| | | |
|---|---|---|
| 9,384,845 B2 | 7/2016 | Yang et al. |
| 2013/0083599 A1* | 4/2013 | Nam ................. G11C 16/14 |
| | | 365/185.11 |
| 2014/0063938 A1* | 3/2014 | Oh .................. H01L 27/11524 |
| | | 365/185.02 |

* cited by examiner

FIG. 16

| STRING | | ERASE BIAS |
|---|---|---|
| | | SB2 ERASE |
| | BL | FLOAT | FLOAT |
| | SSL—SST | FLOAT | FLOAT |
| SB3 | WL12—MC12 | FLOAT | FLOAT |
| | WL11—MC11 | FLOAT | FLOAT |
| | WL10—MC10 | FLOAT | FLOAT |
| | WL9—MC9 | FLOAT | FLOAT |
| SB2 | WL8—MC8 | Vwe | Vwe→FLOAT AT t23 |
| | WL7—MC7 | Vwe | Vwe |
| | WL6—MC6 | Vwe | Vwe |
| | WL5—MC5 | Vwe | Vwe→FLOAT AT t23 |
| SB1 | WL4—MC4 | FLOAT | FLOAT |
| | WL3—MC3 | FLOAT | FLOAT |
| | WL2—MC2 | FLOAT | FLOAT |
| | WL1—MC1 | FLOAT | FLOAT |
| | GSL—GST | VRES | VERS |
| | CSL/SUB | INT21 | INT22 |

FIG. 19

| STRING | | PROGRAM LEVEL | ERASE BIAS |
|---|---|---|---|
| | | | SB2 ERASE |
| | BL | – | FLOAT |
| | SSL –⊣SST | – | FLOAT |
| SB3 | WL12 –⊣MC12 | q-BIT | FLOAT |
| | WL11 –⊣MC11 | q-BIT | FLOAT |
| | WL10 –⊣MC10 | q-BIT | FLOAT |
| | WL9 –⊣MC9 | p-BIT | FLOAT |
| SB2 | WL8 –⊣MC8 | p-BIT | Vwe→FLOAT AT t12 or t23 |
| | WL7 –⊣MC7 | q-BIT | Vwe |
| | WL6 –⊣MC6 | q-BIT | Vwe |
| | WL5 –⊣MC5 | p-BIT | Vwe→FLOAT AT t12 or t23 |
| SB1 | WL4 –⊣MC4 | p-BIT | FLOAT |
| | WL3 –⊣MC3 | q-BIT | FLOAT |
| | WL2 –⊣MC2 | q-BIT | FLOAT |
| | WL1 –⊣MC1 | q-BIT | FLOAT |
| | GSL –⊣GST | – | FLOAT |
| | CSL/SUB | – | VERS |

Vwe<VERS          p<q

METHODS OF OPERATING NONVOLATILE MEMORY DEVICES INCLUDING ERASING A SUB-BLOCK

CROSS-REFERENCE TO RELATED APPLICATION

This U.S. non-provisional patent application claims priority under 35 USC § 119 to Korean Patent Application No. 10-2016-0155680, filed on Nov. 22, 2016, in the Korean Intellectual Property Office (KIPO), the disclosure of which is incorporated in its entirety by reference herein.

BACKGROUND

1. Technical Field

Exemplary embodiments relate generally to semiconductor memory devices, and more particularly to methods of operating nonvolatile memory devices.

2. Discussion of the Related Art

Semiconductor memory devices may be volatile or nonvolatile. Volatile semiconductor memory devices perform read and write operations at a high speed, while contents stored therein may be lost at power-off. Nonvolatile semiconductor memory devices may retain contents stored therein even at power-off. Nonvolatile semiconductor memory devices may be used to store contents that must be retained regardless of whether they are powered.

Flash memory devices are typically nonvolatile semiconductor memory devices. Flash memory devices may be used as a voice and image data storing medium for information appliances, such as a computer, a cellular phone, a PDA, a digital camera, a camcorder, a voice recorder, an MP3 player, a handheld PC, a game machine, a facsimile, a scanner, a printer, and the like.

Recently, semiconductor memory devices having memory cells that are stacked in three dimensions have been researched to improve integrity of the semiconductor memory devices. However, increases in storage capacity may cause various problems such as a soft erase caused by word-line coupling.

SUMMARY

Some exemplary embodiments are directed to provide a method of operating a nonvolatile memory device, capable of increasing reliability of an erase operation.

According to exemplary embodiments, in a method of operating a nonvolatile memory device, a first sub-block to be erased is selected in a first memory block including the first sub-block and a second sub-block adjacent to the first sub-block, in response to a erase command and an address. The first sub-block includes memory cells connected to a plurality of word-lines including at least one boundary word-line adjacent to the second sub-block and internal word-lines other than the at least one boundary word-line. An erase voltage is applied to a substrate in which the first memory block is formed. Based on a voltage level of the erase voltage applied to the substrate, applying, a first erase bias condition to the at least one boundary word-line and a second erase bias condition different from the first erase bias condition to the internal word-lines are differently controlled during an erase operation being performed on the first sub-block.

According to exemplary embodiments, in a method of operating a nonvolatile memory device including a plurality of memory cells, each storing a plurality of bits, the method includes performing a program operation and an erase operation. The program operation performs for a first memory block including a plurality of sub-blocks, each of the sub-blocks including memory cells coupled to a plurality of word-lines. The performing the program operation includes programming p-bit data in each memory cell of first memory cells coupled to at least one boundary word-line of the plurality of word-lines and programming q-bit data in each memory cell of second memory cells coupled to each of internal word-lines other than the at least one boundary word-line of the plurality of word-lines. The at least one boundary word-line is adjacent to another sub-block, p is a natural number equal to or greater than 1 and q is a natural number greater than p. The erase operation performs for a first sub-block in the first memory block including the first sub-block and a second sub-block adjacent to the first sub-block. The performing an erase operation includes, based on a voltage level of an erase voltage applied to a substrate in which the first memory block is formed, applying, a first erase bias condition to the at least one boundary word-line and a second erase bias condition different from the first erase bias condition to the internal word-lines.

According to exemplary embodiments, in a method of operating a nonvolatile memory device including a memory cell array including a plurality of memory blocks, each memory block including a plurality of sub-blocks, each sub-block including a plurality of memory cells, the method includes performing an erase operation. The performing an erase operation includes applying an erase voltage to a substrate in which the first memory block is disposed, applying a word-line erase voltage smaller than the erase voltage to a first word-line of the first sub-block during a first time interval, and applying the word-line erase voltage to a second word-line of the first sub-block during a second time interval longer than the first time interval.

Accordingly, according to exemplary embodiments, the nonvolatile memory device may perform an erase operation by sub-block unit which is smaller than a physical block. When the nonvolatile memory device performs the erase operation by sub-block unit, the nonvolatile memory device controls differently a first erase bias condition for at least one boundary word-line and a second erase bias condition for internal word-lines to prevent memory cells coupled to word-lines adjacent to a selected sub-block from being softly erased.

BRIEF DESCRIPTION OF THE DRAWINGS

Illustrative, non-limiting exemplary embodiments will be more clearly understood from the following detailed description in conjunction with the accompanying drawings.

FIG. 16 illustrates bias condition of sub-blocks when a method of FIG. 15 is employed, according to example embodiments.

FIG. 19 illustrates program levels of memory cells of sub-blocks in program operation and bias condition of sub-blocks in erase operation when the method of FIG. 18 is employed, according to example embodiments.

DETAILED DESCRIPTION

Figure 1:
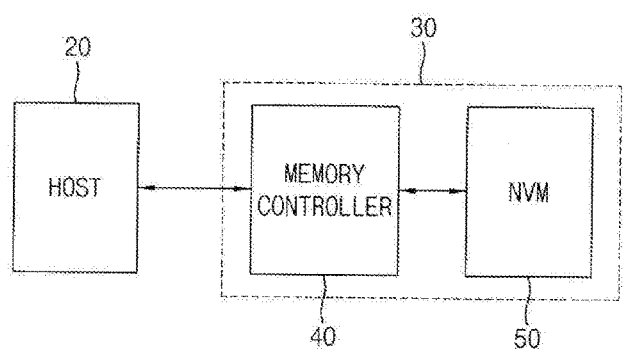
FIG. 1 is a block diagram illustrating an electronic device according to exemplary embodiments.

Various exemplary embodiments will be described more fully hereinafter with reference to the accompanying drawings, in which some exemplary embodiments are shown.

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items. Expressions such as that, although the terms first, second, third etc. may be used herein to describe various elements, these elements should elements of the list.

The embodiments are described, and illustrated in the drawings, in terms of functional blocks, units and/or modules. These blocks, units and/or modules may be physically implemented by electronic (or optical) circuits such as logic circuits, discrete components, microprocessors, hard-wired circuits, memory elements, wiring connections, and the like, which may be formed together in a single integrated circuit (e.g., as a single semiconductor chip) or as separate integrated circuits and/or discrete components (e.g., several semiconductor chips wired together on a printed circuit board) using semiconductor fabrication techniques and/or other manufacturing technologies. These blocks, units and/or modules may be implemented by a processor (e.g., a microprocessor, a controller, a CPU, a GPU) or processors that are programmed using software (e.g., microcode) to perform various functions discussed herein. Each block, unit and/or module may be implemented by dedicated hardware, or as a combination of dedicated hardware to perform some functions and a processor to perform other functions. Also, each block, unit and/or module of the embodiments may be embodied by physically separate circuits and need not be formed as a single integrated.

FIG. 1 is a block diagram illustrating an electronic device according to exemplary embodiments.

Referring to FIG. 1, an electronic device 10 may include a host 20 and a storage device (or, a memory system) 30. The storage device 30 may include a memory controller 40 and at least one nonvolatile memory device 50. The host 20 may control overall operation of the storage device 30.

The nonvolatile memory device 50 may be implemented with a NAND flash memory. In exemplary embodiments, nonvolatile memory device 50 may be nonvolatile memory device such as Phase Change Random Access Memory (PRAM), Resistance Random Access Memory (RRAM), Magneto-resistive Random Access Memory (MRAM), Ferroelectric random access memory (FRAM), etc.

The memory controller 40 may exchange the signals such as a command, an address, data, etc. with the host 20. The memory controller 40 may write data in the nonvolatile memory device 50 and reads data from the nonvolatile memory device 50 according to a command from the host 20.

Figure 2:
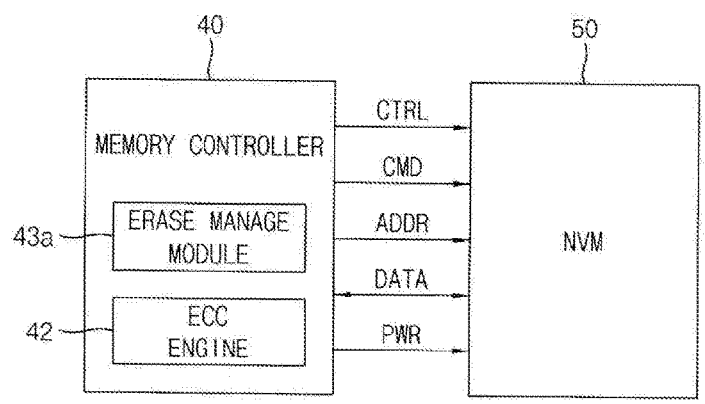
FIG. 2 is a block diagram illustrating the storage device in FIG. 1 according to exemplary embodiments.

FIG. 2 is a block diagram illustrating the storage device in FIG. 1 according to exemplary embodiments.

Referring to FIG. 2, the storage device 30 may include the memory controller 40 and the at least one nonvolatile memory device 50.

In exemplary embodiments, each of the memory controller 40 and the nonvolatile memory device 50 may be provided in the form of a chip, a package, or a module. Alternatively, the memory controller 40 and the nonvolatile memory device 50 may be packaged as a Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP) and etc.

The nonvolatile memory device 50 may perform a read operation, an erase operation, and a program operation or a write operation under control of the memory controller 40. The nonvolatile memory device 50 receives a command CMD, an address ADDR and data DATA through input/output lines from the memory controller 40 for performing such operations. In addition, the nonvolatile memory device 50 receives a control signal CTRL through a control line from the memory controller 40. In addition, the nonvolatile memory device 50 receives a power PWR through a power line from the memory controller 40.

Memory cells of the nonvolatile memory device 200 may have the physical characteristic that a threshold voltage distribution varies due to causes, such as a program elapsed time, a temperature, program disturbance, read disturbance and etc. For example, data stored at the nonvolatile memory device 50 becomes erroneous due to the above causes. The memory controller 40 utilizes a variety of error correction techniques to correct such errors. For example, the memory controller 40 may include an error correction code (ECC) engine 42.

The memory controller 40 may perform an erase operation on the nonvolatile memory device 50 by sub-block unit and the sub-block is smaller than one memory block of the nonvolatile memory device 50. As an example, one memory block may include a plurality of sub-blocks. When the erase operation is performed by sub-block unit, a soft erase may occur to memory cells coupled to a boundary word-line in an unselected sub-block adjacent to a selected sub-block due to word-line coupling. The memory controller 40 may include an erase manage module 43*a* to prevent the soft erase or to manage the erase operation by sub-block unit. An erase operation by sub-block unit may be also referred to as a sub-block erase operation.

After a sub-block erase operation, the erase manage module 43*a* may check an erase status of an erased sub-block and/or a sub-block adjacent to the erased sub-block. For example, the erase manage module 43*a* may sense memory cells of the erased sub-block to determine whether specific parameters exceed a reference value. The erase manage module 43*a* may read data of sub-block(s) adjacent to the erased sub-block to detect erase-inhibition efficiency.

For example, the erase manage module 43*a* may detect bit error rate (BER) based on data read from an erased sub-block. The erase manage module 43*a* may acquire and monitor wear-leveling information (e.g., erase count) on the erased sub-block. In addition, the erase manage module 43*a* may read data of the erased sub-block to monitor a variation in threshold voltages of selected memory cells and/or a variation in the bit error rate (BER). The erase manage module 43*a* may also read data of an unselected sub-block to detect a variation in a threshold voltage.

The memory controller 40 may perform various procedures for compensating for insufficient erasing of a selected sub-block based on erase status information detected by the erase manage module 43*a*. In addition, the memory controller 40 may adjust level of word-line erase voltage and/or a time point of floating a boundary word-line in a sub-block operation to be performed, based on erase status information of the erased sub-block.

Generally, a memory block is the maximum memory unit that may be erased at the same time. In a three-dimensional nonvolatile memory device, where word-lines are stacked in a direction intersecting (e.g., perpendicular to) a substrate, a memory block may be defined as a group of cell strings sharing all stacked word-lines. A sub-block corresponds to a sub-memory unit defined by dividing the memory block (or, physical block) by word line unit or selection line unit. For example, each sub-block may be formed of memory cells sharing a portion of the word-lines of the memory block.

During a read operation, the memory controller 40 may read data stored at a first page of the nonvolatile memory device 50, using a default read voltage set. The default read voltage set may include predetermined read voltages. The ECC engine 42 may detect and correct errors included in data read from the nonvolatile memory device 50. The ECC engine 42 may perform an ECC operation by detecting and correcting errors. In exemplary embodiments, the ECC engine 42 may be implemented in the form of hardware. In example embodiments, the ECC engine 42 may be implemented in the nonvolatile memory device 50.

Figure 3:
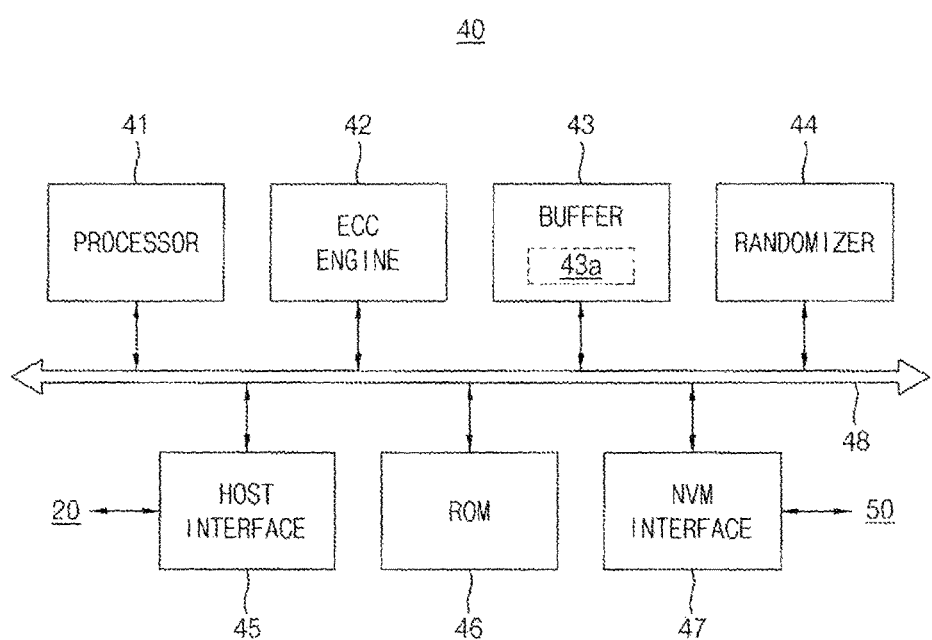
FIG. 3 is a block diagram illustrating the memory controller in the storage device of FIG. 2 according to exemplary embodiments.

FIG. 3 is a block diagram illustrating the memory controller in the storage device of FIG. 2 according to exemplary embodiments.

Referring to FIGS. 2 and 3, the memory controller 40 may include a processor 41, the ECC engine 42, the buffer 43, the erase manage module 43*a*, a randomizer 44, a host interface 45, a read only memory (ROM) 46 and a nonvolatile memory interface 47 which are connected via a bus 48. The ECC engine 42, and the erase manage module 43*a* are described with reference to FIG. 2, and a description thereof is thus omitted.

The processor 41 controls an overall operation of the memory controller 40. In exemplary embodiments, the erase manage module 43*a* may be implemented in software and stored in the buffer 43. The erase manage module 43*a* stored in the buffer 43 may be driven by the processor 41. The ROM 46 stores a variety of information, needed for the memory controller 40 to operate, in firmware.

The buffer 43 may store data provided from the nonvolatile memory device 50 and may include the erase manage module 43*a*.

The randomizer 44 randomizes data to be stored in the nonvolatile memory device 50. For example, the randomizer 44 may randomize data to be stored in the nonvolatile memory device 50 in a unit of a word-line.

Data randomizing is to process data such that program states of memory cells connected to a word-line have the same ratio. For example, if memory cells connected to one word-line are multi-level cells (MLC) each storing 2-bit data, each of the memory cells has one of an erase state and first through third program states. In this case, the randomizer 44 randomizes data such that in memory cells connected to one word-line, the number of memory cells having the erase state, the number of memory cells having the first program state, the number of memory cells having the second program state, and the number of memory cells having the third program state are substantially the same as one another. For example, memory cells in which randomized data is stored have program states of which the number is equal to one another. The randomizer 44 de-randomizes data read from the nonvolatile memory device 50.

The randomizer 44 randomizes page data. For the sake of easy understanding, an ideal operation of the randomizer 44 is described. However, the inventive concept is not limited thereto. For example, the randomizer 44 randomizes data such that in memory cells connected to one word-line, the number of memory cells having the erase state, the number of memory cells having the first program state, the number of memory cells having the second program state, and the number of memory cells having the third program state are approximate to the same value. For example, memory cells in which randomized data is stored have program states of which the number is similar to one another.

The memory controller 40 communicates with the host 20 through the host interface 45. For example, the host interface 45 may include Universal Serial Bus (USB), Multimedia Card (MMC), embedded-MMC, peripheral component interconnection (PCI), PCI-express, Advanced Technology Attachment (ATA), Serial-ATA, Parallel-ATA, small computer small interface (SCSI), enhanced small disk interface (ESDI), Integrated Drive Electronics (IDE), Mobile Industry Processor Interface (MIPI), Nonvolatile memory express (NVMe), Universal Flash Storage (UFS), and etc. The memory controller 40 communicates with the nonvolatile memory device 50 through the nonvolatile memory interface 47.

Figure 4:
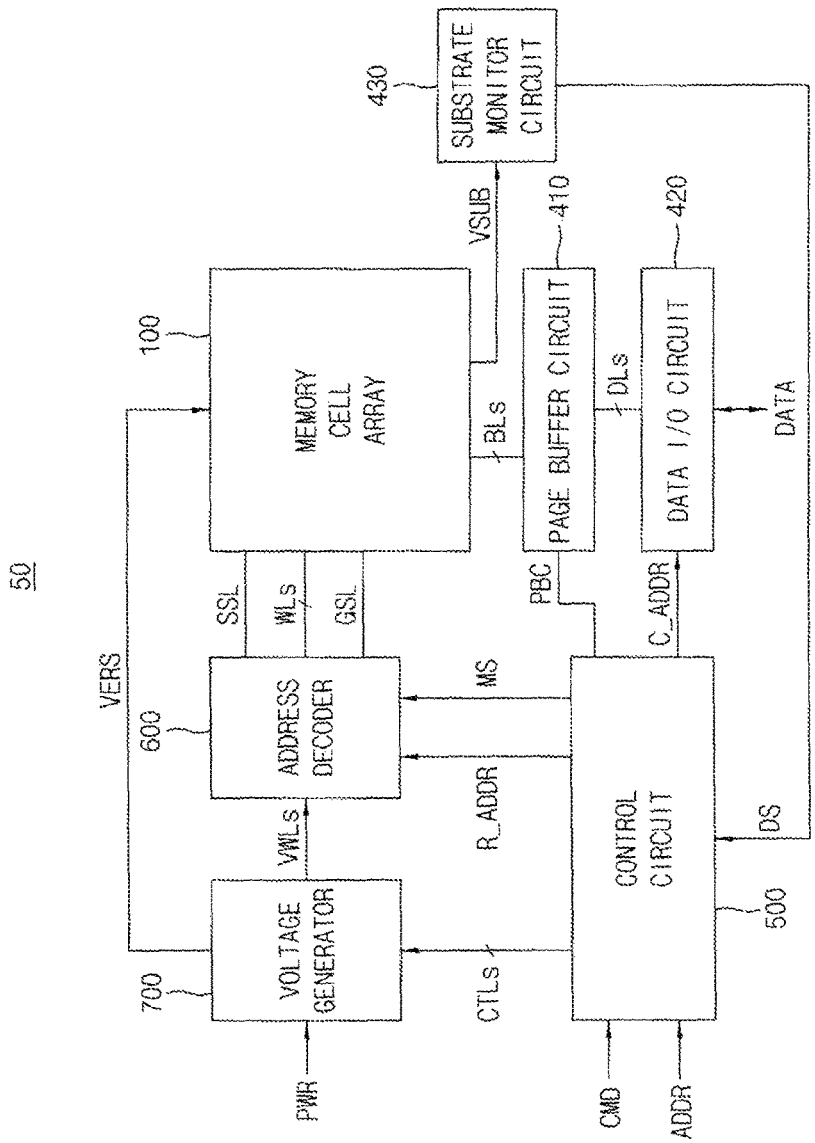
FIG. 4 is a block diagram illustrating the nonvolatile memory device in the storage device of FIG. 2 according to exemplary embodiments.

FIG. 4 is a block diagram illustrating the nonvolatile memory device in the storage device of FIG. 2 according to exemplary embodiments.

Referring to FIG. 4, the nonvolatile memory device 50 includes a memory cell array 100, an address decoder 600, a page buffer circuit 410, a data input/output circuit 420, a substrate monitor circuit 430, a control circuit 500 and a voltage generator 700.

The memory cell array 100 may be coupled to the address decoder 600 through a string selection line SSL, a plurality of word-lines WLs, and a ground selection line GSL. In addition, the memory cell array 100 may be coupled to the page buffer circuit 410 through a plurality of bit-lines BLs.

The memory cell array 100 may include a plurality of memory cells coupled to the plurality of word-lines WLs and the plurality of bit-lines BLs.

In some exemplary embodiments, the memory cell array 100 may be a three-dimensional memory cell array, which is formed on a substrate in a three-dimensional structure (or a vertical structure). In this case, the memory cell array 100 may include vertical cell strings that are vertically oriented such that at least one memory cell is located over another memory cell. The following patent documents, which are hereby incorporated by reference, describe suitable configurations for three-dimensional memory cell arrays: U.S. Pat. Nos. 7,679,133; 8,553,466; 8,654,587; 8,559,235; and US Pat. Pub. No. 2011/0233648.

In other exemplary embodiments, the memory cell array 100 may be a two-dimensional memory cell array, which is formed on a substrate in a two-dimensional structure (or a horizontal structure).

The address decoder 600 may transfer voltages to the string selection line SSL, the plurality of word-lines WLs, and the ground selection line GSL for operating memory cells of the memory cell array 100 in response to an address ADDR and a command CMD received from the memory controller 40 by receiving various voltages VWLs from the voltage generator 700. The voltage generator 700 may provide the word-line voltages VWLs to the address decoder and an erase voltage VERS to the memory cell array 100 in response to control signals CTLs received from the control circuit 500.

Figure 5:
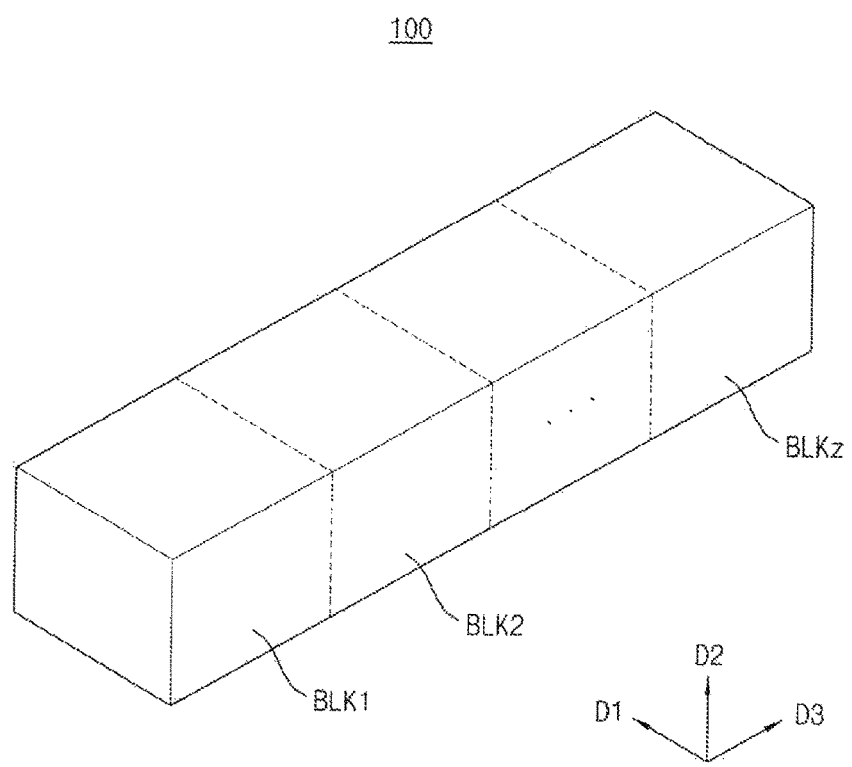
FIG. 5 is a block diagram illustrating the memory cell array in FIG. 4 according to example embodiments.

FIG. 5 is a block diagram illustrating the memory cell array in FIG. 4 according to exemplary embodiments.

Referring to FIG. 5, the memory cell array 100 may include a plurality of memory blocks BLK1 to BLKz. In an embodiment, the memory blocks BLK1 to BLKz are selected by the address decoder 600 in FIG. 4. For example, the address decoder 600 may select a memory block BLK corresponding to a block address among the memory blocks BLK1 to BLKz.

Figure 6:
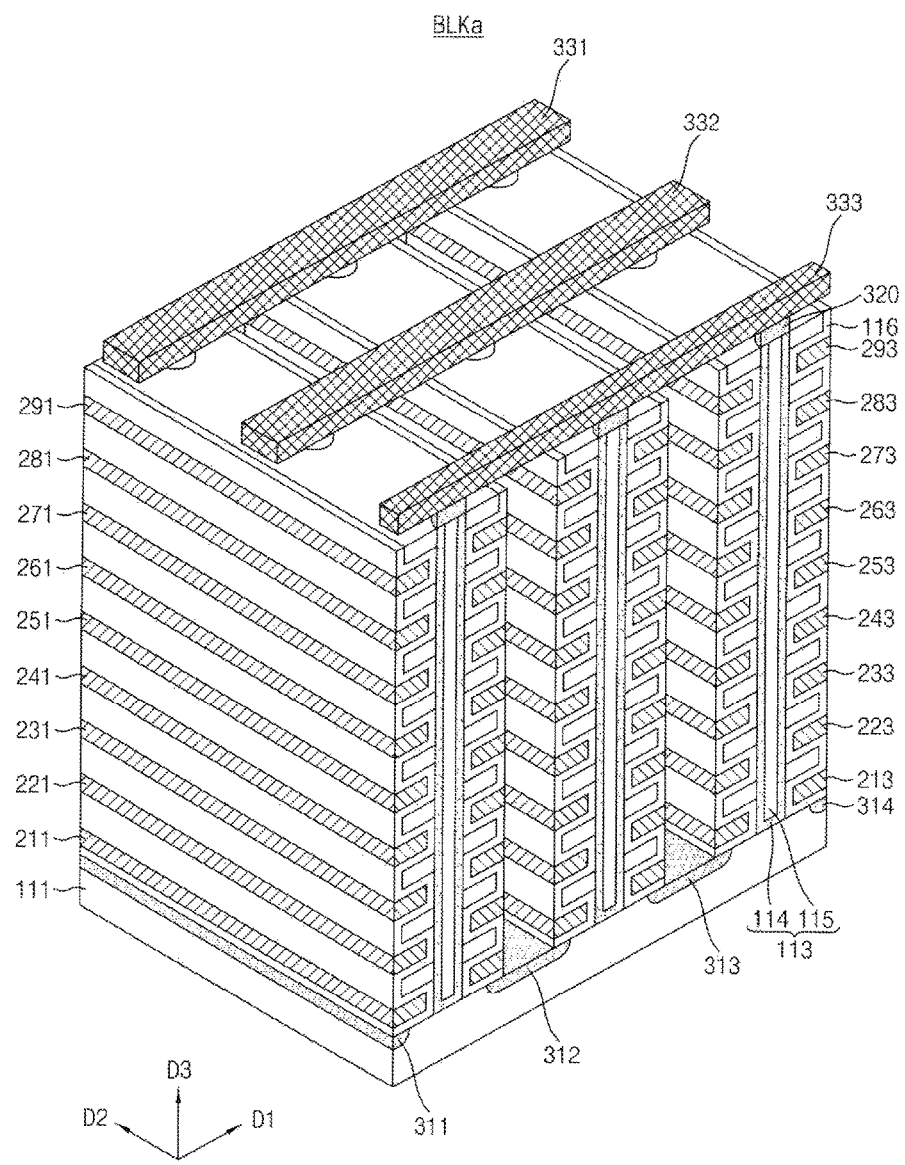
FIG. 6 is a perspective view illustrating one of the memory blocks of FIG. 5 according to exemplary embodiments.

FIG. 6 is a perspective view illustrating one of the memory blocks of FIG. 5 according to exemplary embodiments.

Referring to FIG. 6, a memory block BLKa includes structures extending along the first to third directions D1~D3.

A substrate 111 is provided. For example, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. In an embodiment, the substrate 111 has a p-type well (or a p-type pocket well). However, the conductive type of the substrate 111 is not limited to the p-type.

A plurality of doping regions 311 to 314 extending along the first direction D1 are provided in/on the substrate 111. For example, the plurality of doping regions 311 to 314 may have a second type (e.g., a second conductive type) different from the first type of the substrate 111. In an embodiment, the first to fourth doping regions 311 to 314 have an n-type. However, the conductive type of the first to fourth doping regions 311 to 314 is not limited to the n-type.

A plurality of insulation materials 112 extending along the second direction D2 are sequentially provided along the third direction D3 on a region of the substrate 111 between the first and second doping regions 311 and 312. For example, the plurality of insulation materials 112 are provided along the third direction D3, being spaced by a specific distance. Exemplarily, the insulation materials 112 may include an insulation material such as an oxide layer.

A plurality of pillars 113 penetrating the insulation materials along the third direction D3 are sequentially disposed along the second direction D2 on a region of the substrate 111 between the first and second doping regions 311 and 312. For example, the plurality of pillars 113 penetrate the insulation materials 112 to contact the substrate 111.

For example, each pillar 113 may include a plurality of materials. For example, a channel layer 114 of each pillar 113 may include a silicon material having a first type. For example, the channel layer 114 of each pillar 113 may include a silicon material having the same type as the substrate 111. In an embodiment, the channel layer 114 of each pillar 113 includes a p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. For example, the inner material 115 of each pillar 113 may include an air gap.

An insulation layer 116 is provided along the exposed surfaces of the insulation materials 112, the pillars 113, and the substrate 111, on a region between the first and second doping regions 311 and 312. Exemplarily, the insulation layer 116 provided on the exposed surface in the third direction D3 of the last insulation material 112 may be removed.

A plurality of first conductive materials 211 to 291 is provided between second doping regions 311 and 312 on the exposed surfaces of the insulation layer 116. For example, the first conductive material 211 extending along the second direction D2 is provided between the substrate 111 and the insulation material 112 adjacent to the substrate 111.

A first conductive material extending along the first direction D1 is provided between the insulation layer 116 at the top of a specific insulation material among the insulation materials 112 and the insulation layer 116 at the bottom of a specific insulation material among the insulation materials 112. For example, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may include a metal material. The first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, provided are a plurality of insulation materials 112 extending along the first direction D1, a plurality of pillars 113 disposed sequentially along the first direction D1 and penetrating the plurality of insulation materials 112 along the third direction D3, an insulation layer 116 provided on the exposed surfaces of the plurality of insulation materials 112 and the plurality of pillars 113, and a plurality of conductive materials 213 to 293 extending along the first direction D1.

In a region between the third and fourth doping regions 313 and 314, the same structures as those on the first and second doping regions 311 and 312 may be provided. In the region between the third and fourth doping regions 313 and 314, provided are a plurality of insulation materials 112 extending along the first direction D1, a plurality of pillars 113 disposed sequentially along the first direction D1 and penetrating the plurality of insulation materials 112 along the third direction D3, an insulation layer 116 provided on the exposed surfaces of the plurality of insulation materials 112 and the plurality of pillars 113, and a plurality of first conductive materials 213 to 293 extending along the first direction D1.

Drains 320 are provided on the plurality of pillars 113, respectively. On the drains, the second conductive materials 331 to 333 extending along the first direction D1 are provided. The second conductive materials 331 to 333 are disposed along the second direction D2, being spaced by a specific distance. The second conductive materials 331 to 333 are respectively connected to the drains 320 in a corresponding region. The drains 320 and the second conductive material 333 extending along the first direction D1 may be connected through each contact plug. The second conductive materials 331 to 333 may include metal materials. The second conductive materials 331 to 333 may include conductive materials such as a polysilicon.

Figure 7:
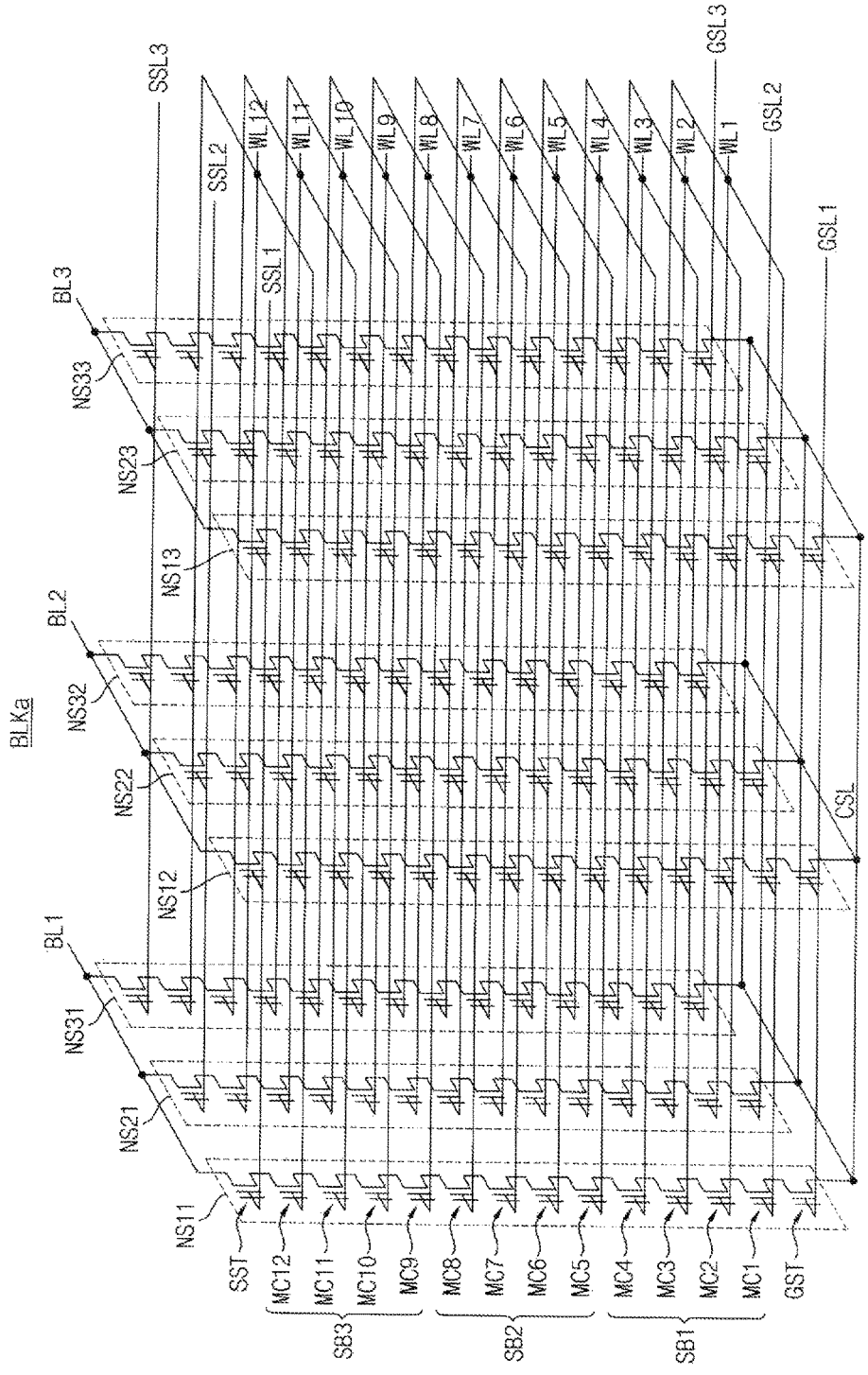
FIG. 7 is an equivalent circuit diagram illustrating the memory block of FIG. 6 according to exemplary embodiments.

FIG. 7 is an equivalent circuit diagram illustrating the memory block of FIG. 6 according to exemplary embodiments.

The memory block BLKa of FIG. 7 may be formed on a substrate in a three-dimensional structure (or a vertical structure). For example, a plurality of memory cell strings included in the memory block BLKa may be formed in a direction perpendicular to the substrate.

Referring to FIG. 7, the memory block BLKa may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC12, and a ground selection transistor GST. In FIG. 7, each of the memory cell strings NS11 to NS33 is illustrated to include twelve memory cells MC1 to MC12. However, exemplary embodiments are not limited thereto.

In some exemplary embodiments, each of the memory cell strings NS11 to NS33 may include any number of memory cells.

The string selection transistor SST may be connected to corresponding string selection lines SSL1 to SSL3. The plurality of memory cells MC1 to MC12 may be connected to corresponding word-lines WL1 to WL12, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

In example embodiments, dummy memory cells connected to a dummy word-line (not shown) may be coupled between the string selection transistor SST and the memory cell MC12 and/or coupled between the ground selection transistor GST and the memory cell MC1. For example, dummy memory cells may be simultaneously formed with normal memory cells with the same processes. A dummy memory cell may be activated by a dummy word-line, but may not have any "data" stored to read from a device external. For instance, data stored in a dummy memory cell electrically connected to a dummy word-line may not be transmitted outside of the memory cell array through selection signals provided by the column decoder, as is the case for normal memory cells. For instance, a dummy memory cell electrically connected to a dummy word-line may not have any connection to a bit line to transmit data there between as with normal memory cells.

Word-lines (e.g., WL1) having the same height may be commonly connected, and the ground selection lines GSL1 to GSL3 and the string selection lines SSL1 to SSL3 may be separated. In FIG. 7, the memory block BLKa is illustrated to be coupled to twelve word-lines WL1 to WL12 and three bit-lines BL1 to BL3. However, exemplary embodiments are not limited thereto. In some exemplary embodiments, the memory cell array 100 may be coupled to any number of word-lines and bit-lines.

According to exemplary embodiments, the memory block BLKa is divided into a plurality of sub-blocks, indicated by representative sub-blocks SB1, SB2, and SB3, each sub-block being smaller in size than the memory block BLKa. The sub-blocks SB1, SB2 and SB3 may be divided in a word-line direction, as shown in FIG. 7. Alternatively, the sub-blocks SB1, SB2 and SB3 may be divided on the basis of bit-lines or string selection lines. The sub-blocks SB1, SB2 and SB3 in the memory block BLKa may be erased independently regardless of the reference used to divide the memory block BLKa into sub-blocks.

For example, the sub-block SB1 include memory cells coupled to the word-lines WL1, WL2, WL3 and WL4, the sub-block SB2 includes memory cells coupled to the word-lines WL5, WL6, WL7 and WL8, and the sub-block SB3 includes memory cells coupled to the word-lines WL9, WL10, WL11 and WL12, from among the memory cells included in the memory block BLKa. The memory cells included in the sub-block SB1 may be selected and erased independently of the remaining sub-blocks SB2 and SB3, and vice versa. One or more of the sub-blocks SB1, SB2, and SB3 may be selected and erased at the same time or at different times. The address decoder 600 of the nonvolatile memory device 50 (refer to FIG. 4) may provide a bias for erasing memory cells by sub-block unit.

In exemplary embodiments, the memory block (a physical block) BLKa may include two sub-blocks or four or more sub-blocks. In addition, one sub-block may include two or three word-lines or may include five or more word-lines. The sub-blocks may be adjacent to each other in a vertical direction perpendicular to the substrate 111.

Referring back to FIG. 4, the control circuit 500 may receive the command (signal) CMD and the address (signal) ADDR from the memory controller 40 and control an erase operation, a program operation and a read operation of the nonvolatile memory device 50 based on the command signal CMD and the address signal ADDR.

In example embodiments, the control circuit 500 may generate the control signals CTLs, which are used for controlling the voltage generator 700, and may generate the page buffer control signal PBC for controlling the page buffer circuit 410, based on the command signal CMD, and generate a row address R_ADDR and a column address C_ADDR based on the address signal ADDR. The control circuit 500 may provide the row address R_ADDR to the address decoder 600 and provide the column address C_ADDR to the data input/output circuit 420. In addition, the control circuit 500 may provide the address decoder with a detection signal DS provided from the substrate monitor circuit 430. The mode signal MS indicates that a voltage level of the substrate 111 reaches a reference level or indicates that the voltage level of the substrate 111 is maintained at a constant level during a reference time interval.

The address decoder 600 may be coupled to the memory cell array 100 through the string selection line SSL, the plurality of word-lines WLs, and the ground selection line GSL. During the program operation or the read operation, the address decoder 600 may determine one of the plurality of word-lines WLs as a selected word-line and determine rest of the plurality of word-lines WLs other than the selected word-line as unselected word-lines based on the row address R_ADDR.

The voltage generator 700 may generate word-line voltages VWLs, which are required for the operation of the nonvolatile memory device 50, based on the control signals CTLs. The voltage generator 700 may receive the power PWR from the memory controller 40. The word-line voltages VWLs may be applied to the plurality of word-lines WLs through the address decoder 600.

For example, during the sub-block erase operation, the voltage generator 700 may apply an erase voltage VERS to a well of the memory block or the substrate 111 and may apply a word-line erase voltage (e.g., a ground voltage) to word-lines of a selected sub-block. During the erase verification operation, the voltage generator 700 may apply an erase verification voltage to the entire word-lines of the selected sub-block or sequentially apply the erase verification voltage to word-lines of the selected sub-block on a word-line basis.

For example, during the program operation, the voltage generator 700 may apply a program voltage to the selected word-line and may apply a program pass voltage to the unselected word-lines. In addition, during the program verification operation, the voltage generator 700 may apply a program verification voltage to the selected word-line and may apply a verification pass voltage to the unselected word-lines.

In addition, during the read operation, the voltage generator 700 may apply a read voltage to the selected word-line and may apply a read pass voltage to the unselected word-lines.

The page buffer circuit 410 may be coupled to the memory cell array 100 through the plurality of bit-lines BLs. The page buffer circuit 410 may include a plurality of page buffers. In some exemplary embodiments, one page buffer may be connected to one bit-line. In other exemplary embodiments, one page buffer may be connected to two or more bit-lines.

The page buffer circuit 410 may temporarily store data to be programmed in a selected page or data read out from the selected page of the memory cell array 100.

The data input/output circuit 420 may be coupled to the page buffer circuit 410 through data lines DLs. During the program operation, the data input/output circuit 420 may receive program data DATA from the memory controller 40 and provide the program data DATA to the page buffer circuit 410 based on the column address C_ADDR received from the control circuit 500. During the read operation, the data input/output circuit 420 may provide read data DATA, which are stored in the page buffer circuit 410, to the memory controller 40 based on the column address C_ADDR received from the control circuit 500.

In addition, the page buffer circuit 410 and the data input/output circuit 420 read data from a first area of the memory cell array 100 and write the read data to a second area of the memory cell array 100. That is, the page buffer circuit 410 and the data input/output circuit 420 may perform a copy-back operation.

During the erase operation, the substrate monitor circuit 430 may monitor a voltage level of a substrate voltage (or a voltage level of the substrate 111) VSUB in response to the erase voltage VERS applied to the substrate and may provide the control circuit 500 with the detection signal DS indicating that a level of the substrate voltage VSUB reaches a reference level or indicating that the level of the substrate voltage VSUB is maintained at a level of the erase voltage VERS during a reference time interval. The detection signal DS may include a plurality of bits and the plurality of bits may indicate that the level of the substrate voltage VSUB reaches the reference level or that the level of the substrate voltage VSUB is maintained at a level of the erase voltage VERS during the reference time interval.

Figure 8:
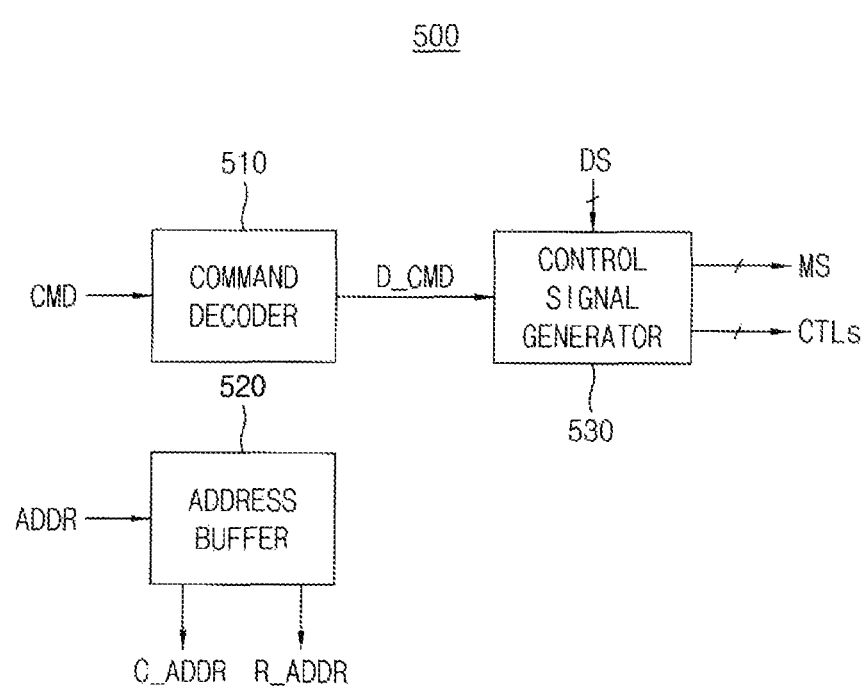
FIG. 8 is a block diagram illustrating the control circuit in the nonvolatile memory device of FIG. 4 according to example embodiments.

FIG. 8 is a block diagram illustrating the control circuit in the nonvolatile memory device of FIG. 4 according to example embodiments.

Referring to FIG. 8, the control circuit 500 includes a command decoder 510, an address buffer 520 and a control signal generator 530.

The command decoder 510 decodes the command CMD and provides a decoded command D_CMD to the control signal generator 530. The address buffer 520 receives the address signal ADDR, provides the row address R_ADDR to the address decoder 600 and provides the column address C_ADDR to the data input/output circuit 420.

The control signal generator 530 receives the decoded command D_CMD, generates the control signals CTLs based on an operation directed by the decoded command D_CMD and provides the control signals CTLs to the voltage generator 700. In addition, the control signal generator 530 receives the detection signal DS and provides the address decoder 600 with a mode signal MS indicating that the level of the substrate voltage VSUB reaches the reference level or that the level of the substrate voltage VSUB is maintained at a level of the erase voltage VERS during the reference time interval, based on the detection signal DS.

Figure 9:
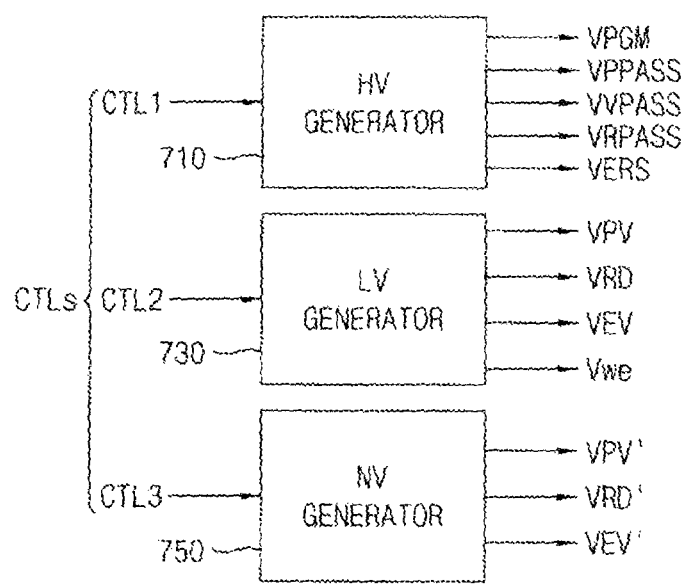
FIG. 9 is a block diagram illustrating the voltage generator in the nonvolatile memory device of FIG. 4 according to exemplary embodiments.

FIG. 9 is a block diagram illustrating the voltage generator in the nonvolatile memory device of FIG. 4 according to exemplary embodiments.

Referring to FIG. 9, the voltage generator 700 may include a high voltage generator 710 and a low voltage generator 730. The voltage generator 700 may further include a negative voltage generator 750.

The high voltage generator 710 may generate a program voltage PGM, a program pass voltage VPPASS, a verification pass voltage VVPASS, a read pass voltage VRPASS and an erase voltage VERS according to operations directed by a command CMD (or, a decoded command D_CMD), in response to a first control signal CTL1 of the control signals CTLs. The program voltage VPGM is applied to the selected word-line, the program pass voltage VPPASS, the verification pass voltage VVPASS, the read pass voltage VRPASS may be applied to the unselected word-lines and the erase voltage VERS may be applied to the well or the substrate of the memory block. The first control signal CTL1 may include a plurality of bits which indicate the operations directed by the command CMD.

The low voltage generator 730 may generate a program verification voltage VPV, a read voltage VRD, an erase verification voltage VER and a word-line erase voltage Vwe according to operations directed by the command CMD, in response to a second control signal CTL2 of the control signals CTLs. The program verification voltage VEV, the read voltage VRD, and the erase verification voltage VEV may be applied to the selected word-line according to operation of the nonvolatile memory device 200. The word-line erase voltage Vwe may be applied to word-lines of the selected sub-block. The second control signal CTL2 may include a plurality of bits which indicate the operations directed by the command CMD.

The negative voltage generator 750 may generate a program verification voltage VPV', a read voltage VRD' and an erase verification voltage VEV' which have negative levels according to operations directed by the command CMD, in response to a third control signal CTL3 of the control signals CTLs. The third control signal CTL3 may include a plurality of bits which indicate the operations directed by the command CMD.

Figure 10:
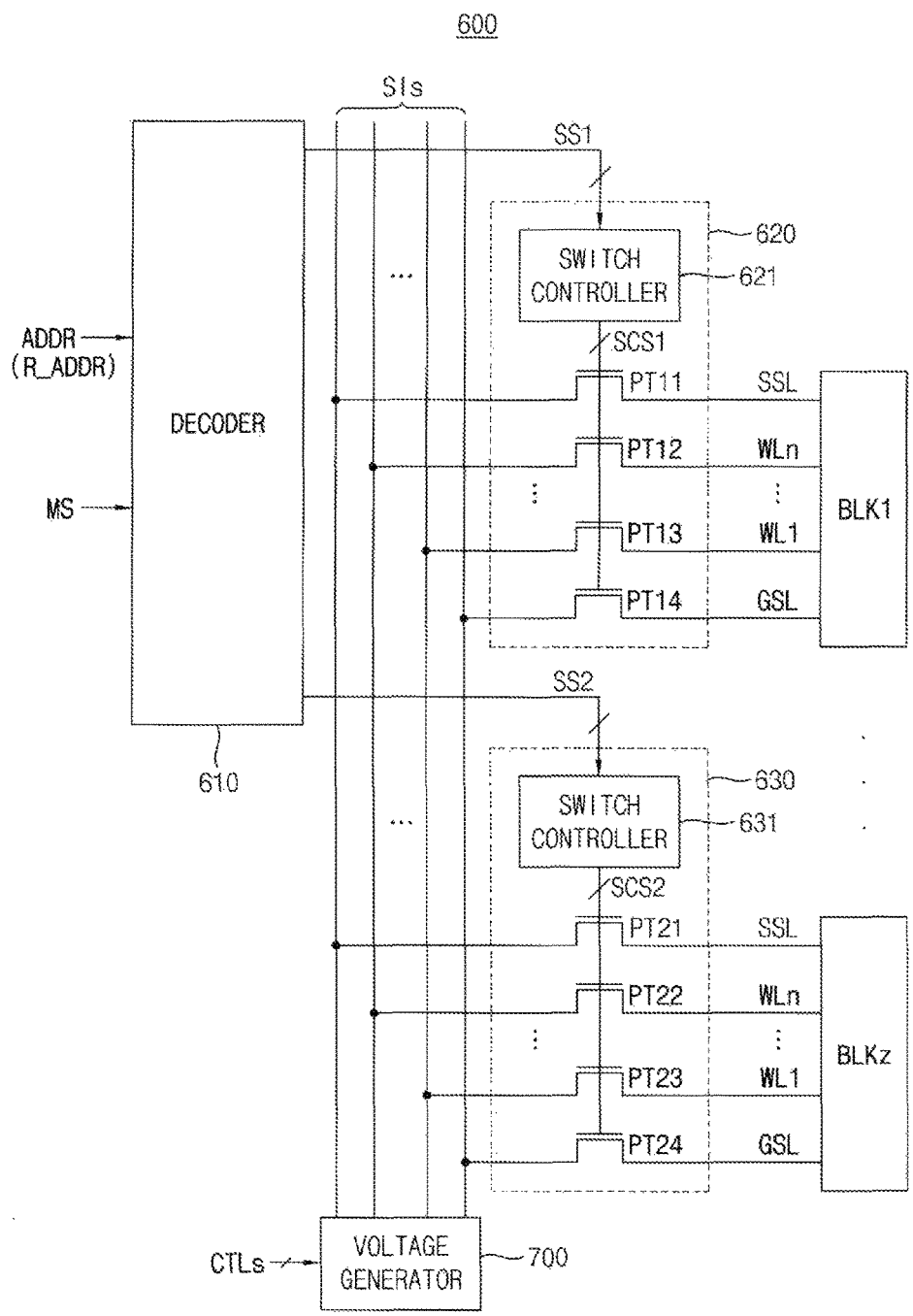
FIG. 10 is a block diagram illustrating the address decoder in the nonvolatile memory device of FIG. 4 according to exemplary embodiments.

FIG. 10 is a block diagram illustrating the address decoder in the nonvolatile memory device of FIG. 4 according to exemplary embodiments.

Referring to FIG. 10, the address decoder 600 includes a decoder 610, a first switch circuit 620 and a second switch circuit 630.

The decoder 610 receives the address ADDR (e.g., the row address R_ADDR) and the mode signal MS, generates a first selection signal SS1 and a second selection signal SS2 according to a sub-block directed by the address ADDR and the level of the substrate voltage VSUB or maintaining time interval of the substrate voltage VSUB indicated by the mode signal and provides the first selection signal SS1 and the second selection signal SS2 to the first switch circuit 620 and the second switch circuit 630, respectively. As an example, each of the first selection signal SS1 and the second selection signal SS2 may have a plurality of selection signals for selecting a block among the plurality of blocks in the memory cell array 100.

The first switch circuit 620 and the second switch circuit 630 may be coupled to a plurality of selection lines Sls coupled to the voltage generator 700. The voltage generator 700 may provide the various voltages VWLs to the plurality of selection lines Sls. The first switch circuit 620 is coupled to the memory block BLK1 through at least one string selection line SSL, a plurality of word-lines WL1~WLn and at least one ground selection line GSL. The second switch circuit 630 is coupled to the memory block BLKz through at least one string selection line SSL, a plurality of word-lines WL1~WLn and at least one ground selection line GSL.

The first switch circuit 620 includes a switch controller 621 and a plurality of pass transistors PT11~PT14 coupled to the string selection line SSL, the word-lines WL1~WLn and the ground selection line GSL of the memory block BLK1. The switch controller 621 may control turn-on and turn-off of the pass transistors PT11~PT14 by providing a first switching control signal SCS1 to the pass transistors PT11~PT14 in response to the first selection signal SS1. As an example, the first switching control signal SCS1 may have a plurality of first switching control signals for selecting a sub-block among the plurality of sub-blocks in the memory block BLK1 in response to the first selection signal SS1. As an example, the switch controller 621 may control turn-on timing (e.g., a time interval) of the pass transistors PT11~PT14 by selecting a particular time interval from among a plurality of different time intervals in response to the first switching control signals of the first switching control signal SCS1.

The second switch circuit 630 includes a switch controller 631 and a plurality of pass transistors PT21~PT24 coupled to the string selection line SSL, the word-lines WL1~WLn and the ground selection line GSL of the memory block BLKz. The switch controller 631 may control turn-on and turn-off of the pass transistors PT21~PT24 by providing a second switching control signal SCS2 to the pass transistors PT21~PT24 in response to the second selection signal SS2. As an example, the second switching control signal SCS2 may have a plurality of second switching control signals for selecting a sub-block among the plurality of sub-blocks in the memory block BLKz in response to the second selection signal SS2. The switch controller 631 may control turn-on timing (e.g., a time interval) of the pass transistors PT21~PT24 by selecting a particular time interval from among a plurality of different time intervals in response to the second switching control signals of the second switching control signal SCS2.

Figure 11:
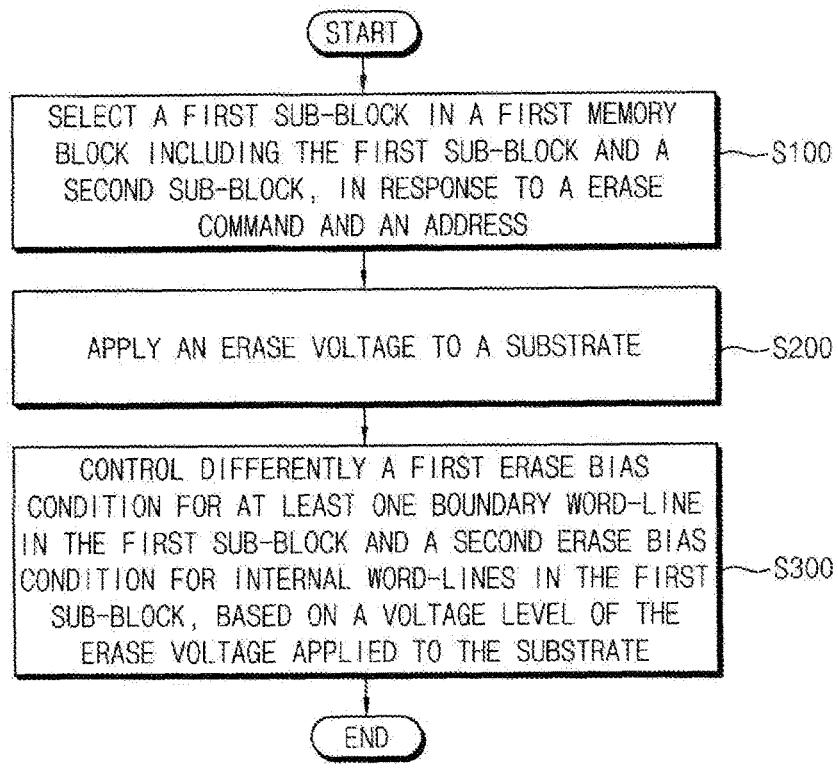
FIG. 11 is a flow chart illustrating a method of operating a nonvolatile memory device according to exemplary embodiments.

FIG. 11 is a flow chart illustrating a method of operating a nonvolatile memory device according to exemplary embodiments.

Referring to FIGS. 2 through 11, in a method of operating a nonvolatile memory device 50, the nonvolatile memory device 50 selects a first sub-block to be erased in a first memory block including the first sub-block and a second sub-block, in response to a erase command CMD and an address ADDR provided from the memory controller 40 (S100). The first sub-block and the second sub-block are adjacent to each other. The first sub-block includes a plurality of word-lines and the plurality of word-lines includes at least one boundary word-line adjacent to the second sub-block and internal word-lines other than the at least one boundary word-line of the plurality of word-lines. The voltage generator 700 applies an erase voltage VERS to the substrate of the first memory block under control of the control circuit 500 (S200). The address decoder 600 controls differently a first erase bias condition for the at least one boundary word-line of the first sub-block and a second erase bias condition for the internal word-lines during an erase operation being performed on the first sub-block, based on a voltage level of the erase voltage applied to the substrate 111 (S300). The address decoder 600 controls differently the first erase bias condition and the second erase bias condition during a first interval and a second interval successive to the first interval. During the first interval, the voltage level of the substrate 111 increases with a constant slope and during the second interval the voltage level of the substrate 111 is maintained at a constant level.

Figure 12:
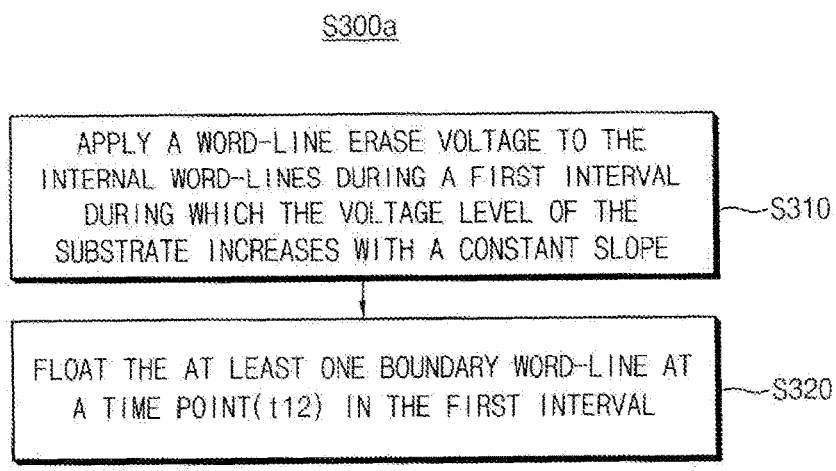
FIG. 12 is a flow chart illustrating an exemplary method of controlling first and second erase bias conditions differently in FIG. 11 according to example embodiments.
Figure 13:
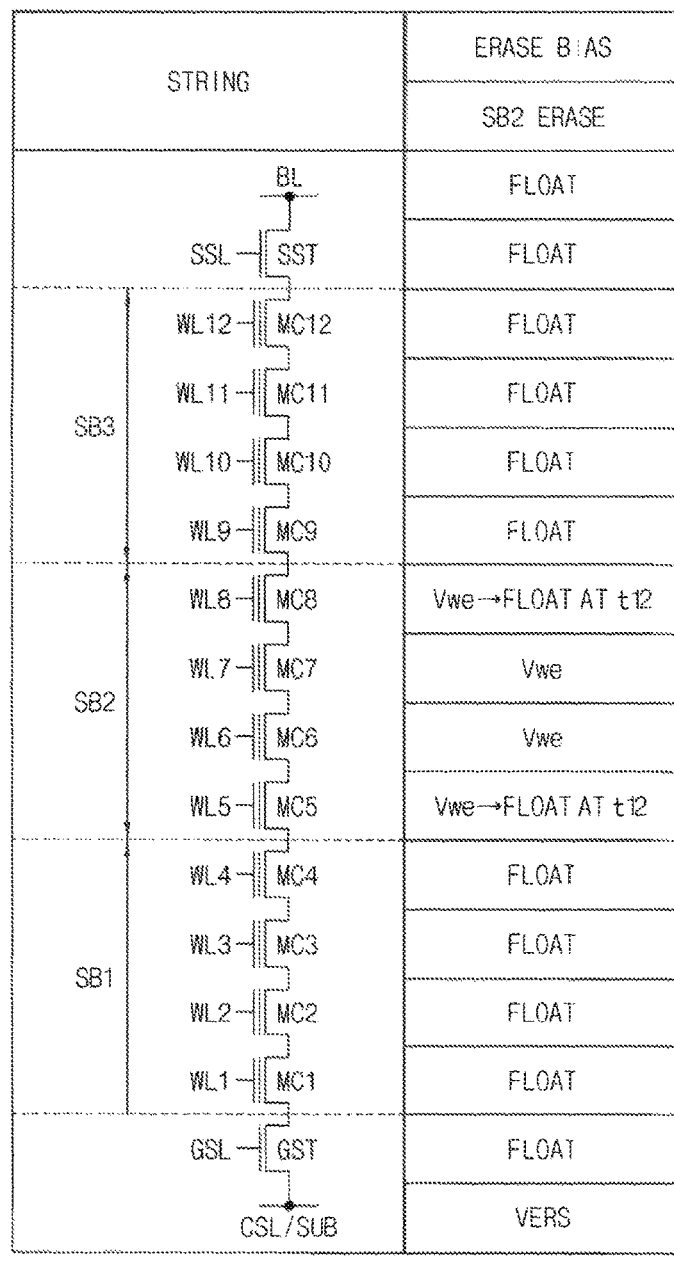
FIG. 13 illustrates bias condition of sub-blocks when a method of FIG. 12 is employed according to example embodiments.
Figure 14A:
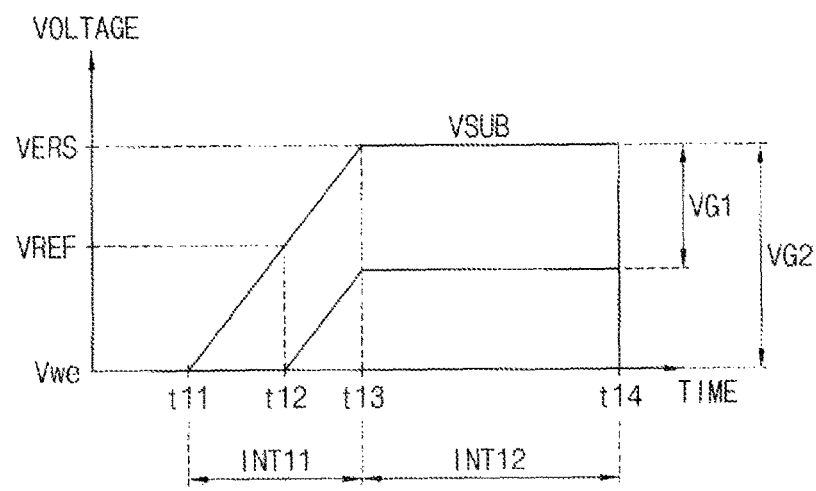
FIG. 14A illustrates a voltage change of the selected sub-block and a voltage change of the substrate a method of FIG. 12 is employed, according to example embodiments.
Figure 14B:
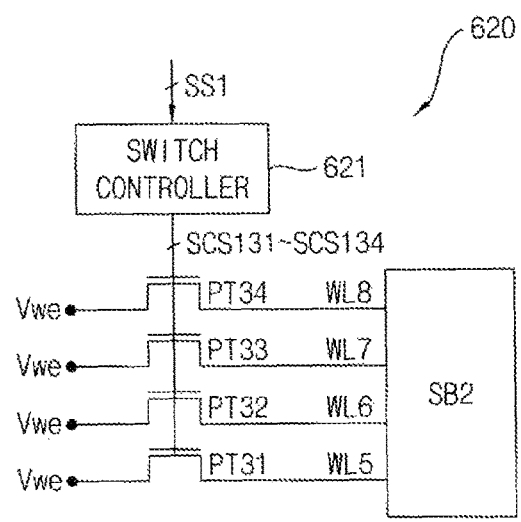
FIG. 14B illustrates the first switch circuit in FIG. 9 when a method of FIG. 12 is employed, according to example embodiments.

FIG. 12 is a flow chart illustrating an exemplary method of controlling first and second erase bias conditions differently in FIG. 11 according to example embodiments, FIG. 13 illustrates bias condition of sub-blocks when a method of FIG. 12 is employed, according to example embodiments, FIG. 14A illustrates a change in voltage of the selected sub-block and a change in voltage of the substrate when a method of FIG. 12 is employed, according to example embodiments and FIG. 14B illustrates the first switch circuit in FIG. 9 when a method of FIG. 12 is employed, according to example embodiments.

In FIG. 13, it is assumed that the sub-block SB2 is selected among the sub-blocks SB1, SB2 and SB3 in the memory block BLKa of FIG. 7.

Referring to FIGS. 12, 13, 14A, and 14B, for controlling the first bias condition and the second bias condition differently (S300a), the address decoder 600 applies a word-line erase voltage Vwe to internal word-lines WL6 and WL7 in the selected sub-block SB2 during a first interval INT11 during which the voltage level VSUB of the substrate 111 increases with a constant slope (S310). The word-line erase voltage Vwe may have a ground voltage level or a positive voltage level which is substantially the same as the ground voltage level.

The first interval INT11 starts from a time point t11 at which the erase voltage VERS is applied to the substrate 111 and ends at a time point t13 at which the voltage level VSUB of the substrate 111 reaches a target voltage level of the erase voltage VERS. The address decoder 600 floats at least one boundary word-line WL5 and WL8 of the selected sub-block SB2 at a time point t12 in the first interval INT11 while the word-line erase voltage Vwe is applied to the internal word-lines WL6 and WL7 in the first interval INT11 (S320).

When the boundary word-lines WL5 and WL8 are floated at the time point t12, each voltage level of the boundary word-lines WL5 and WL8 follows the voltage level VSUB of the substrate 111. The time point t12 may be a time point at which the voltage level VSUB reaches a reference level VREF in response to the erase voltage VERS applied to the substrate 111. It is assumed that an erase operation may be performed at the reference level VREF.

The address decoder 600 may still apply the word-line erase voltage Vwe to the internal word-lines WL6 and WL7 during a second interval INT12 successive to the first interval INT11 and each voltage level of the boundary word-lines WL5 and WL8 is maintained at a constant level due to floating during the second interval INT12. The second interval INT12 starts from the time point t13 and ends at a time point t14 at which an application of the erase voltage VERS is cut off. A voltage difference between each of the internal word-lines WL6 and WL7 and a channel thereof corresponds to a voltage difference of VG2, and a voltage difference between each of the boundary word-lines WL5 and WL8 and a channel thereof corresponds to a voltage difference of VG1.

In example embodiments, the word-line erase voltage Vwe may be applied to the boundary word-lines WL5 and WL8 of the second sub-block SB2 during a first time interval (e.g., between the time point t11 and the time point t12), and the word-line erase voltage Vwe may be applied to the internal word-lines WL6 and WL7 of the second sub-block SB2 during a second time interval (e.g., between the time point t11 and the time point t14) longer than the first time interval. In this case, the first and second time intervals overlap during the first time interval (e.g., between the time point t11 and the time point t12).

In exemplary embodiments, the boundary word-line may include a normal word-line coupled to normal memory cells or a dummy word-line coupled to dummy memory cells depending on a location of a selected sub-block.

In the case of erasing information of a specific sub-block (for example, the sub-block SB2) in a nonvolatile memory device performing an erase operation by sub-block unit, a word-line interference phenomenon due to an erase operation occurs in boundary word-lines WL4 and WL9 of unselected sub-blocks SB1 and SB3 adjacent to the selected sub-block SB2. The interference phenomenon may cause a charge spreading phenomenon in memory cells connected to a word-line of an unselect sub-block adjacent to a sub-block selected for an erase operation.

Charges captured by a memory cell may move to a substrate by the charge spreading phenomenon and this means that information stored in a memory cell may be inadvertently erased. A soft erase may occur in a memory cell by the charge spreading phenomenon. Thus, reliability of information stored in a memory cell may decrease in the erase operation.

For preventing the soft erase in the conventional nonvolatile memory device, thickness of an oxide layer of boundary of sub-blocks or copy back operation is performed, which before an erase operation, valid information of memory cells connected to an adjacent word-line in which a word-line interference phenomenon may occur is copied to other word-line and after the erase operation, the valid information is written back in the adjacent word-line. However, complexity of fabricating the nonvolatile memory device increases or time required for erase operation increases according to the conventional schemes.

In exemplary embodiments, during the sub-block erase operation for the selected sub-block SB2, the word-line erase voltage Vwe is applied to the boundary word-lines WL5 and WL8 and the boundary word-lines WL5 and WL8 are floated when the voltage level VSUB of the substrate 111 reaches the reference level VREF. Therefore, since a voltage difference between the boundary word-line WL5 and the adjacent word-line WL4 adjacent to the boundary word-line WL5, and a voltage difference between the boundary word-line WL8 and the adjacent word-line WL9 adjacent to the boundary word-line WL8 are reduced, the soft erase that may occur in the adjacent word-lines WL4 and WL9 may be prevented.

Word-lines WL1~WL4 in the unselected sub-block SB1, word-lines WL9~WL12 in the unselected sub-block SB3, the ground selection line GSL and the string selection line SSL are floated during the first interval INT11 and the second interval INT12 while the sub-block erase operation is performed on the selected sub-block SB2.

Since the word-lines WL1~WL4 in the unselected sub-block SB1 and the word-lines WL9~WL12 in the unselected sub-block SB3 are floated during the first interval INT11 and the second interval INT12, voltages of the word-lines WL1~WL4 and the word-lines WL9~WL12 are boosted up to a high voltage level due to capacitive coupling when the erase voltage VERS, which is a high voltage, is applied to the substrate 111. In this case, the voltage difference between the word-lines WL1~WL4 and the word-lines WL9~WL12 and the channel thereof is insufficient to generate F-N tunneling. Therefore, memory cells in the unselected sub-blocks SB1 and SB3 may be erase-inhibited.

On the contrary, if the word-line erase voltage Vwe is applied to the boundary word-lines WL5 and WL8 during the first interval INT11 and the second interval INT12, without floating the boundary word-lines WL5 and WL8 at the time point t12, voltages of the adjacent word-lines WL4 and WL9 may rise less than voltages of the word-lines WL1~WL3 and WL10 and WL12 due to capacitive coupling by the word-line erase voltage Vwe. Therefore, the voltage difference between the adjacent word-lines WL4 and WL9 and the channel may generate weak F-N tunneling and thus, memory cells coupled to the adjacent word-lines WL4 and WL9 may be softly erased.

In exemplary embodiments, influence of the capacitive coupling may be reduced by floating the boundary word-lines WL5 and WL8 at the time point t12 in the first interval INT11.

In addition, a number of at least one boundary word-line, a number of internal word-lines and a number of adjacent word-lines may vary depending on a location of the selected sub-block in FIG. 13.

Referring to FIG. 14B, each of the word-lines WL5~WL8 of the selected sub-block SB2 is coupled to each of pass transistors PT31~PT34 and each of switching control signals SCS131~SCS134 is applied to each gate of the pass transistors PT31~PT34. The switch controller 621 enables the switching control signals SCS131~SCS134 until the time point t12 in the first interval INT11 and disables the switching control signals SCS131 and SCS134 at the time point t12 to float the boundary word-lines WL5 and WL8, in response to the first selection signal SS1.

Figure 15:
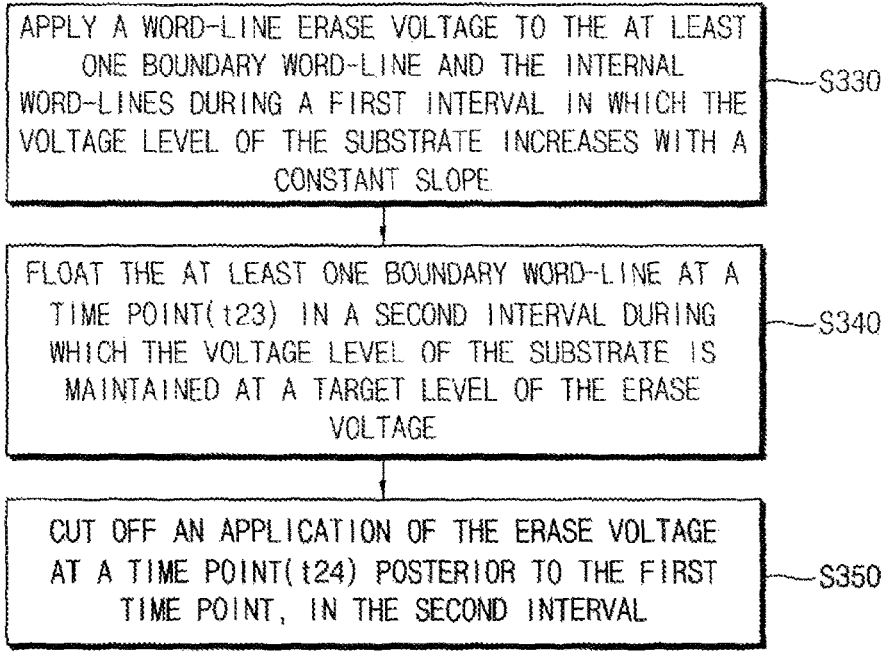
FIG. 15 is a flow chart illustrating another example of controlling first and second erase bias conditions differently in FIG. 11 according to example embodiments.
Figure 17:
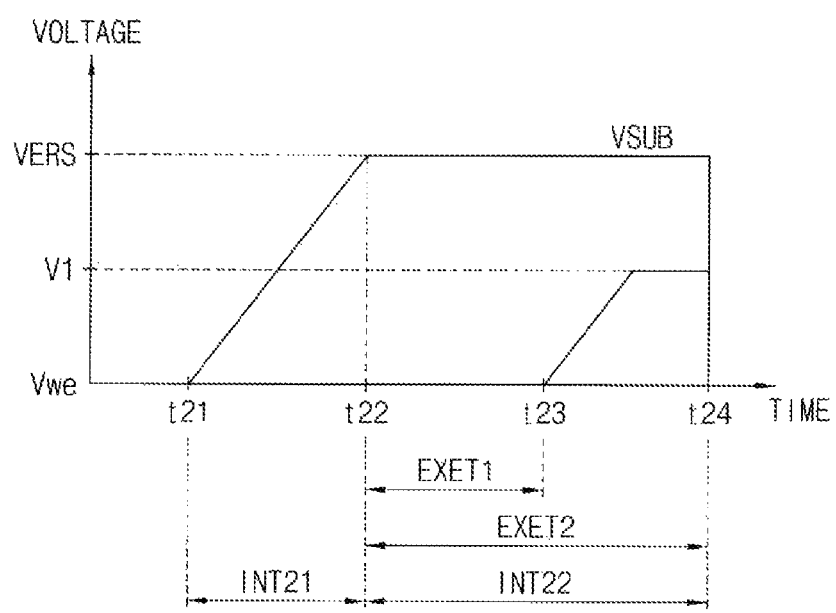
FIG. 17 illustrates a voltage change of the selected sub-block and a voltage change of the substrate a method of FIG. 15 is employed, according to example embodiments.

FIG. 15 is a flow chart illustrating another example of controlling first and second erase bias conditions differently in FIG. 11, according to example embodiments, FIG. 16 illustrates bias condition of sub-blocks when a method of FIG. 15 is employed, according to example embodiments, and FIG. 17 illustrates a change in voltage of the selected sub-block and a change in voltage of the substrate when a method of FIG. 15 is employed, according to example embodiments.

In FIG. 15, it is assumed that the sub-block SB2 is selected among the sub-blocks SB1, SB2 and SB3 in the memory block BLKa of FIG. 7.

Referring to FIGS. 15 through 17, for controlling a first bias condition and a second bias condition differently (S300b), the address decoder 600 applies a word-line erase voltage Vwe to boundary word-lines WL5 and WL8 and internal word-lines WL6 and WL7 in the selected sub-block SB2 during a first interval INT21 during which the voltage level VSUB of the substrate 111 increases with a constant slope (S330). The word-line erase voltage Vwe may have a ground voltage level or a positive voltage level which is substantially the same as the ground voltage level.

The first interval INT21 starts from a time point t21 at which the erase voltage VERS is applied to the substrate 111 and ends at a time point t22 at which the voltage level VSUB of the substrate 111 reaches a target voltage level of the erase voltage VERS. The address decoder 600 floats at least one boundary word-line WL5 and WL8 of the selected sub-block SB2 at a time point t23 in a second interval INT22 during which voltage level VSUB of the substrate 111 is maintained at the target level of the erase voltage VERS (S340). The second interval INT22 is successive to the first interval INT21. When the boundary word-lines WL5 and WL8 are floated at the time point t23, each voltage level of the boundary word-lines WL5 and WL8 is maintained at a constant level V1 which rises from the word-line erase voltage Vwe.

The voltage generator 700 cuts off application of the erase voltage VERS to the substrate 111 at a time point t24 later than the time point t23. Then, the sub-block erase operation is performed on memory cells coupled to the boundary word-lines WL5 and WL8 during a first erase execution time interval EXET1 and the sub-block erase operation is performed on memory cells coupled to the internal word-lines WL6 and WL7 during a second erase execution time interval EXET2.

The first erase execution time interval EXET1 is smaller than the second erase execution time interval EXET2. Therefore, since an erase execution time interval during which the sub-block erase operation performed on the memory cells coupled to the boundary word-lines WL5 and WL8 is reduced, a time interval during which coupling phenomenon on adjacent word-lines WL4 and WL9 adjacent to the selected sub-block SB2 thereby to prevent the soft erase phenomenon that may occur in the adjacent word-lines WL4 and WL9 may be reduced.

In example embodiments, the word-line erase voltage Vwe may be applied to the boundary word-lines WL5 and WL8 of the second sub-block SB2 during a first time interval (e.g., between the time point t21 and the time point t23), and the word-line erase voltage Vwe may be applied to the internal word-lines WL6 and WL7 of the second sub-block SB2 during a second time interval (e.g., between the time point t21 and the time point t24) longer than the first time interval. In this case, the first and second time intervals overlap during the first time interval (e.g., between the time point t21 and the time point t23).

Referring back to FIG. 14B, The switch controller 621 enables the switching control signals SCS131~SCS134 until the time point t23 in the second interval INT22 and disables the switching control signals SCS131 and SCS134 at the time point t23 to float the boundary word-lines WL5 and WL8, in response to the first selection signal SS1.

Word-lines WL1~WL4 in the unselected sub-block SB1, word-lines WL9~WL12 in the unselected sub-block SB3, the ground selection line GSL and the string selection line SSL are floated during the first interval INT21 and the second interval INT22 while the sub-block erase operation is performed on the selected sub-block SB2.

Figure 18:
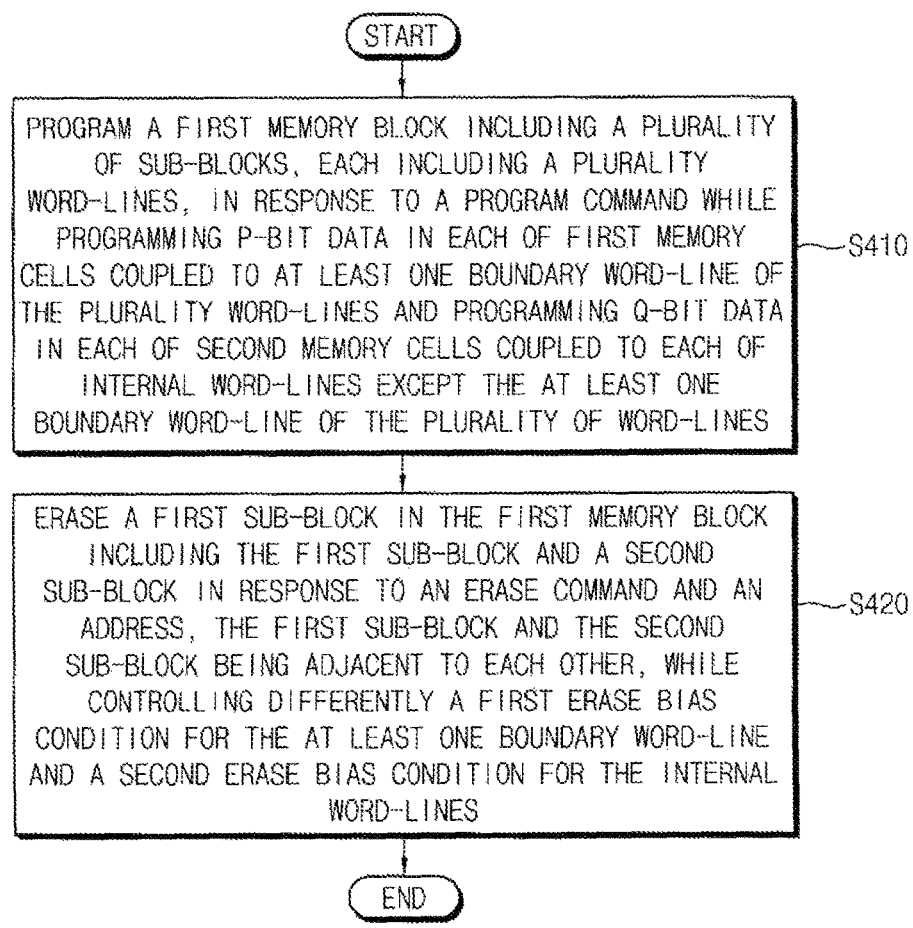
FIG. 18 is a flow chart illustrating a method of operating a nonvolatile memory device according to exemplary embodiments.

FIG. 18 is a flow chart illustrating a method of operating a nonvolatile memory device according to exemplary embodiments.

FIG. 19 illustrates program levels of memory cells of sub-blocks in program operation and bias condition of sub-blocks in erase operation when the method of FIG. 18 is employed, according to example embodiments.

Referring to FIGS. 2 through 10, 18 and 19, in a method of operating a nonvolatile memory device 50 including a plurality of memory cells, each storing a plurality of bits, the nonvolatile memory device 50 programs a first memory block including a plurality of sub-blocks, in response to a program command CMD from the memory controller 40 (S410). Each of the sub-blocks includes a plurality of word-lines. When the nonvolatile memory device 50 programs the first memory block, the nonvolatile memory device 50 programs p-bit data in each of first memory cells coupled to at least one boundary word-line of the plurality of word-lines and programs q-bit data in each of second memory cells coupled to each of internal word-lines other than the at least one boundary word-line of the plurality of word-lines. The at least one boundary word-line is adjacent to other sub-block, p is a natural number equal to or greater than 1 and q is a natural number greater than p.

The address decoder 600, in response to an erase command CMD and an address ADDR from the memory controller 40, erases a first sub-block or a second sub-block in the first memory block including the first sub-block and the second sub-block while controlling differently a first erase bias condition for the at least one boundary word-line and a second erase bias condition for the internal word-lines, based on a voltage level of the substrate 111 in response to an erase voltage VERS applied to the substrate 111 in which the first memory block is formed. The first sub-block and the second sub-block are adjacent to each other. The address decoder 600 controls differently the first erase bias condition and the second erase bias condition during a first interval and a second interval successive to the first interval. During the first interval, the voltage level of the substrate 111 increases with a constant slope and during the second interval the voltage level of the substrate 111 is maintained at a constant level.

In FIG. 19, it is assumed that the sub-block SB2 is selected among the sub-blocks SB1, SB2 and SB3 in the memory block BLKa of FIG. 7.

During the program operation, q-bit data is programmed in each of memory cells coupled to internal word-lines WL1~WL3 of the sub-block SB1, and p-bit data is programmed in memory cells coupled to a boundary word-line WL4 of the sub-block SB1. During the program operation, q-bit data is programmed in each of memory cells coupled to internal word-lines WL6 and WL7 of the sub-block SB2, and p-bit data is programmed in each of memory cell coupled to boundary word-lines WL5 and WL8 of the sub-block SB2. During the program operation, q-bit data is programmed in each of memory cells coupled to internal word-lines WL10~WL12 of the sub-block SB3, and p-bit data is programmed in memory cells coupled to a boundary word-line WL9 of the sub-block SB3.

Since q-bit data is programmed in each of memory cells coupled to each of internal word-lines and q-bit data is programmed in each of memory cells coupled to each of boundary word-lines, each first margin between two adjacent program states of the memory cells coupled to each of the boundary word-lines is greater than each second margin between two adjacent program states of the memory cells coupled to each of the internal word-lines.

During the sub-block erase operation, as described with reference to FIG. 14A, the address decoder 600 applies a word-line erase voltage Vwe to internal word-lines WL6 and WL7 in the selected sub-block SB2 during a first interval INT11 during which the voltage level VSUB of the substrate 111 increases with a constant slope and the address decoder 600 floats at least one boundary word-line WL5 and WL8 of the selected sub-block SB2 at a time point t12 in the first interval INT11. Therefore, soft erase phenomenon that may occur in the memory cells coupled to the adjacent word-lines WL4 and WL9 adjacent to the selected sub-block SB2 may be prevented or may be reduced.

Although not illustrated in FIG. 19, as described with reference to FIG. 17, the address decoder 600 floats at least one boundary word-line WL5 and WL8 of the selected sub-block SB2 at a time point t23 in the second interval INT22 during which voltage level VSUB of the substrate 111 is maintained at the level of the erase voltage VERS. Therefore, soft erase phenomenon that may occur in the memory cells coupled to the adjacent word-lines WL4 and WL9 adjacent to the selected sub-block SB2 may be prevented or may be reduced.

Figure 20:
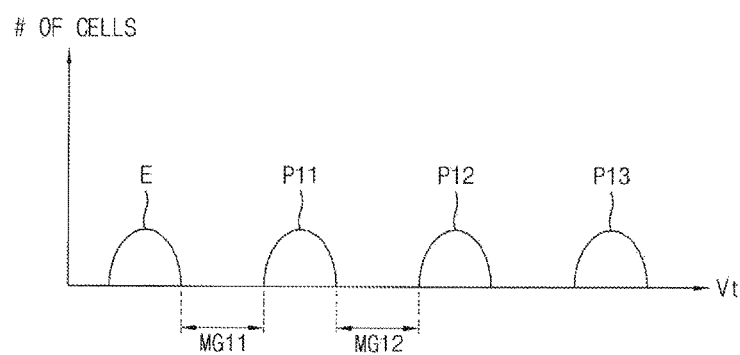
FIG. 20 illustrates threshold voltage distributions of memory cells coupled to boundary word-lines in FIG. 19 according to example embodiments.
Figure 21:
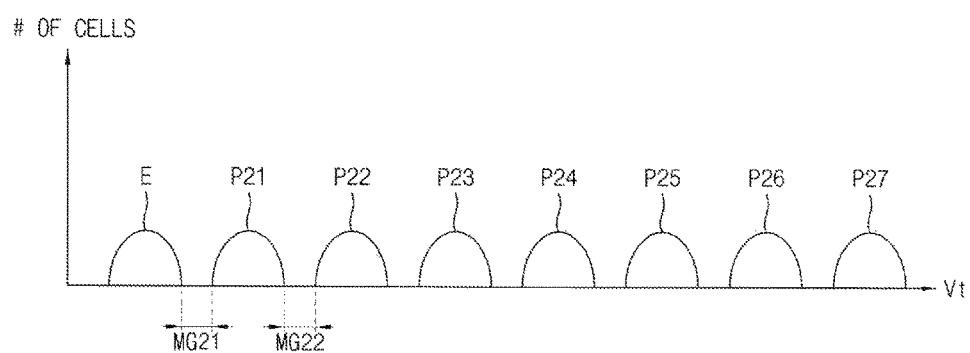
FIG. 21 illustrates threshold voltage distributions of memory cells coupled to internal word-lines in FIG. 19 according to example embodiments.

FIG. 20 illustrates threshold voltage distributions of memory cells coupled to boundary word-lines in FIG. 19 according to example embodiments, and FIG. 21 illustrates threshold voltage distributions of memory cells coupled to internal word-lines in FIG. 19 according to example embodiments.

In FIG. 20, it is assumed that each of memory cells coupled to the boundary word-line stores 2-bit data and in FIG. 21, it is assumed that each of memory cells coupled to the internal word-line stores 3-bit data.

Referring to FIG. 20, each of the memory cells coupled to the boundary word-line may have one state of an erased state E and first through third program states P11~P13.

Referring to FIG. 21, each of the memory cells coupled to the internal word-line may have one state of an erased state E and first through seventh program states P21~P27.

A margin MG11 between the erased state E and the first program state P11 in the memory cells coupled to each of the boundary word-lines is greater than a margin MG21 between the erased state E and the first program state P21 in the memory cells coupled to each of the internal word-lines. In addition, a margin MG12 between the first program state P11 and the second program state P12 in the memory cells coupled to each of the boundary word-lines is greater than a margin MG22 between the first program state P21 and the second program state P22 in the memory cells coupled to each of the internal word-lines. As en example, when the sub-block erase operation is performed on the selected sub-block SB2, influence of coupling generated by applying the word-line erase voltage Vwe may be reduced because the margin between program states in the memory cells coupled to the adjacent word-lines WL4 and WL9 is great.

Figure 22:
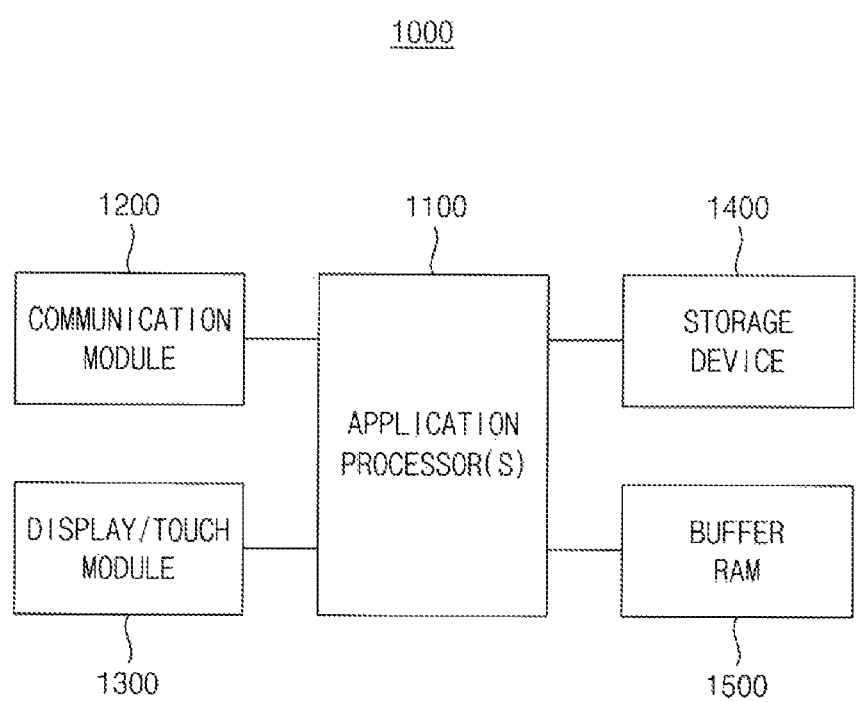
FIG. 22 is a block diagram illustrating a mobile device according to example embodiments.

FIG. 22 is a block diagram illustrating a mobile device according to example embodiments.

Referring to FIG. 22, a mobile device 1000 may include an application processor 1100, a communication module 1200, a display/touch module 1300, a storage device 1400, and a buffer RAM 1500.

The application processor 1100 controls operations of the mobile device 1000. The communication module 1200 is implemented to perform wireless or wire communications with an external device. The display/touch module 1300 is implemented to display data processed by the application processor 1100 or to receive data through a touch panel. The storage device 1400 may be implemented to store user data.

The storage device 1400 may be eMMC, SSD, UFS device, etc. The storage device 1400 may employ the storage device 30 of FIG. 2. The storage device 1400 may include a memory controller and at least one nonvolatile memory device. The at least one nonvolatile memory device may include the nonvolatile memory device 50 of FIG. 4. For example, the nonvolatile memory device may perform an erase operation by sub-block unit which is smaller than a physical block. When the nonvolatile memory device performs the erase operation by sub-block unit, the nonvolatile memory device controls differently a first erase bias condition for at least one boundary word-line and a second erase bias condition for internal word-lines to prevent memory cells coupled to word-lines adjacent to a selected sub-block from being softly erased.

The buffer RAM 1500 temporarily stores data used for processing operations of the mobile device 1000.

A nonvolatile memory device or a storage device according to exemplary embodiments may be packaged using various package types or package configurations.

The present disclosure may be applied to various electronic devices including a nonvolatile memory device. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims.

What is claimed is:

1. A method of operating a nonvolatile memory device, the method comprising:
   selecting a first sub-block to be erased in a first memory block including the first sub-block and a second sub-block, adjacent to the first sub-block, in response to an erase command and an address, wherein the first sub-block includes memory cells connected to a plurality of word-lines including at least one boundary word-line adjacent to the second sub-block and internal word-lines other than the at least one boundary word-line, and wherein each of the memory cells connected to the at least one boundary word-line stores a plurality of bits;
   applying an erase voltage to a substrate in which the first memory block is formed; and
   based on a voltage level of the erase voltage applied to the substrate, applying a first erase bias condition to the at least one boundary word-line and a second erase bias condition different from the first erase bias condition to the internal word-lines during an erase operation being performed on the first sub-block,
   wherein the voltage level of the erase voltage applied to the substrate increases with a constant slope during a first interval and the voltage level of the erase voltage applied to the substrate is maintained at a constant level during a second interval successive to the first interval,
   wherein the first erase bias condition comprises applying a word-line erase voltage to the at least one boundary word-line during the first interval and floating the at least one boundary word-line at a first time point in the first interval or in the second interval, and
   wherein the second erase bias condition comprises applying the word-line erase voltage to the internal word-lines during the first and second intervals.

2. The method of claim 1, wherein the first time point corresponds to a time point at which the voltage level of the erase voltage applied to the substrate reaches a reference voltage level.

3. The method of claim 1, wherein a level of the erase voltage is higher than a level of the word-line erase voltage and the word-line erase voltage is a ground voltage or higher than the ground voltage.

4. The method of claim 1, wherein the word-line erase voltage is applied to the internal word-lines until a second time point in the second interval and the at least one boundary word-line is floated until the second time point in the second interval.

5. The method of claim 4, further comprising:
   floating word-lines of unselected sub-blocks in the first memory block other than the first sub-block during the second interval.

6. The method of claim 1,
   wherein the first erase bias condition further comprises cutting off an application of the erase voltage at a second time point in the second interval, wherein the second time point is later than the first time point, and
   wherein the second erase bias condition further comprises cutting off an application of the erase voltage at the second time point in the second interval.

7. The method of claim 6, wherein the word-line erase voltage is applied to the internal word-lines and the at least one boundary word-line until the first time point in the second interval.

8. The method of claim 6, further comprising:
   floating word-lines of unselected sub-blocks in the first memory block other than the first sub-block during the first interval and the second interval.

9. The method of claim 6, wherein a first erase execution time taken for erasing memory cells coupled to the at least one boundary word-line is smaller than a second erase execution time taken for erasing memory cells coupled to each of the internal word-lines.

10. The method of claim 1, wherein:
    the first memory block comprises a plurality of cell strings,
    each of the plurality of cell strings comprises a plurality of memory cells stacked in a vertical direction which is perpendicular to the substrate,
    the first sub-block and the second sub-block are adjacent to each other in the vertical direction, and
    the at least one boundary word-line corresponds to a normal word-line coupled to normal memory cells.

11. A method of operating a nonvolatile memory device including a plurality of memory cells, each storing a plurality of bits, the method comprising:
    performing a program operation for a first memory block including a plurality of sub-blocks, each sub-block including memory cells coupled to a plurality of word-lines, wherein performing the program operation includes:
       programming p-bit data in each memory cell of first memory cells coupled to at least one boundary word-line of the plurality of word-lines; and
       programming q-bit data in each memory cell of second memory cells coupled to each of internal word-lines other than the at least one boundary word-line of the plurality of word-lines,
    wherein the at least one boundary word-line is adjacent to another sub-block, p is a natural number greater than 1 and q is a natural number greater than p; and
    performing an erase operation for a first sub-block in the first memory block including the first sub-block and a second sub-block adjacent to the first sub-block, wherein performing the erase operation includes:
       based on a voltage level of an erase voltage applied to a substrate in which the first memory block is formed, applying a first erase bias condition to the at least one boundary word-line and a second erase bias condition different from the first erase bias condition to the internal word-lines,
    wherein the voltage level of the erase voltage applied to the substrate increases with a constant slope during a first interval and the voltage level of the erase voltage applied to the substrate is maintained at a target level during a second interval successive to the first interval,
    wherein the first erase bias condition comprises applying a word-line erase voltage smaller than the erase voltage to the at least one boundary word-line of the first sub-block until a first time point in the first interval and floating the at least one boundary word-line from the first time point in the first interval or in the second interval, and wherein the second erase bias condition comprises applying the word-line erase voltage to the internal word-lines of the first sub-block during the first interval and the second interval.

12. The method of claim 11, wherein the first erase bias condition further comprises cutting off an application of the erase voltage at a second time point in the second interval, wherein the second time point is later than the first time point, and wherein the second erase bias condition further comprises cutting off an application of the erase voltage at the second time point in the second interval.

13. The method of claim 11, wherein the first memory block comprises a plurality of cell strings, each of the plurality of cell strings comprises a plurality of memory cells stacked in a vertical direction which is perpendicular to the substrate, the first sub-block and the second sub-block are adjacent to each other in the vertical direction, and the at least one boundary word-line corresponds to a normal word-line coupled to normal memory cells.

14. A method of operating a nonvolatile memory device including a memory cell array including a plurality of memory blocks, each memory block including a plurality of sub-blocks, each sub-block including a plurality of memory cells, the method comprising:

performing an erase operation for a first sub-block of a first memory block, wherein performing the erase operation comprises:

applying an erase voltage to a substrate in which the first memory block is disposed;

applying a word-line erase voltage smaller than the erase voltage to a first word-line of the first sub-block during a first time interval; and applying the word-line erase voltage to a second word-line of the first sub-block during a second time interval longer than the first time interval, wherein the first word-line is adjacent to an unselected sub-block of the first memory block and the second word-line is not adjacent to the unselected sub-block, and wherein each of memory cells connected to the first word-line stores a plurality of bits.

15. The method of claim 14, further comprising:

while applying the word-line erase voltage to the second word-line, after applying the word-line erase voltage to the first word-line, floating the first word-line from a time point at which the erase voltage applied to the substrate reaches a first voltage level smaller than a target voltage level of the erase voltage.

16. The method of claim 14, further comprising:

while applying the word-line erase voltage to the second word-line, after applying the word-line erase voltage to the first word-line, floating the first word-line from a time point at which the erase voltage applied to the substrate is maintained at a target voltage level of the erase voltage.

17. The method of claim 14, wherein the plurality of sub-blocks in each memory blocks are stacked vertically with respect to the substrate.

18. The method of claim 14, wherein the first and second time intervals overlap during the first time interval.

\* \* \* \* \*